US010074732B1

(12) United States Patent
Dou et al.

(10) Patent No.: US 10,074,732 B1
(45) Date of Patent: Sep. 11, 2018

(54) METHODS OF FORMING SHORT CHANNEL AND LONG CHANNEL FINFET DEVICES SO AS TO ADJUST THRESHOLD VOLTAGES

(71) Applicant: GLOBALFOUNDRIES Inc., Grand Cayman (KY)

(72) Inventors: Xinyuan Dou, Clifton Park, NY (US); Hui Zang, Guilderland, NY (US); Hong Yu, Rexford, NY (US); Yanzhen Wang, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/622,902

(22) Filed: Jun. 14, 2017

(51) Int. Cl.
*H01L 29/00* (2006.01)
*H01L 21/8228* (2006.01)
*H01L 29/66* (2006.01)
*H01L 21/8234* (2006.01)
*H01L 29/78* (2006.01)

(52) U.S. Cl.
CPC ............ *H01L 29/66818* (2013.01); *H01L 21/823431* (2013.01); *H01L 29/785* (2013.01)

(58) Field of Classification Search
CPC .................. H01L 29/66818; H01L 29/785

USPC .......... 257/67, 206, 327, 341, 401; 438/163
See application file for complete search history.

(56) References Cited

U.S. PATENT DOCUMENTS

| 6,583,469 | B1 | 6/2003 | Fried et al. | |
|---|---|---|---|---|
| 9,082,698 | B1 * | 7/2015 | Joshi | H01L 29/66795 |
| 9,331,202 | B2 * | 5/2016 | Liu | H01L 29/66545 |
| 9,461,044 | B1 * | 10/2016 | Chang | H01L 27/0886 |
| | | | | 438/197 |
| 2014/0001562 | A1 | 1/2014 | Liaw | |

* cited by examiner

*Primary Examiner* — Calvin Lee
(74) *Attorney, Agent, or Firm* — Amerson Law Firm, PLLC

(57) ABSTRACT

One illustrative method disclosed herein includes, among other things, forming first and second fins for a short channel FinFET device ("SCD") and a long channel FinFET device ("LCD"), performing an oxidation process to form a sacrificial oxide material selectively on the channel portion of one of the first and second fins but not on the channel portion of the other of the first and second fins, removing the sacrificial oxide material from the fin on which it is formed so as to produce a reduced-size channel portion on that fin that is less than the initial size of the channel portion of the other non-oxidized fin, and forming first and second gate structures for the SCD and LCD devices.

14 Claims, 20 Drawing Sheets

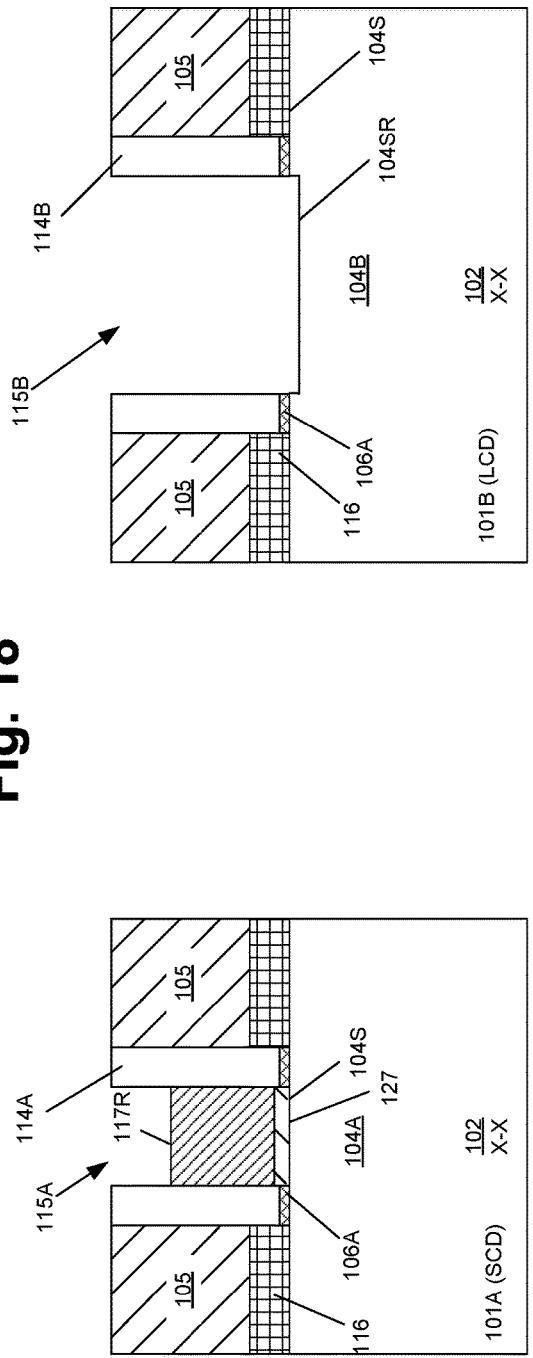
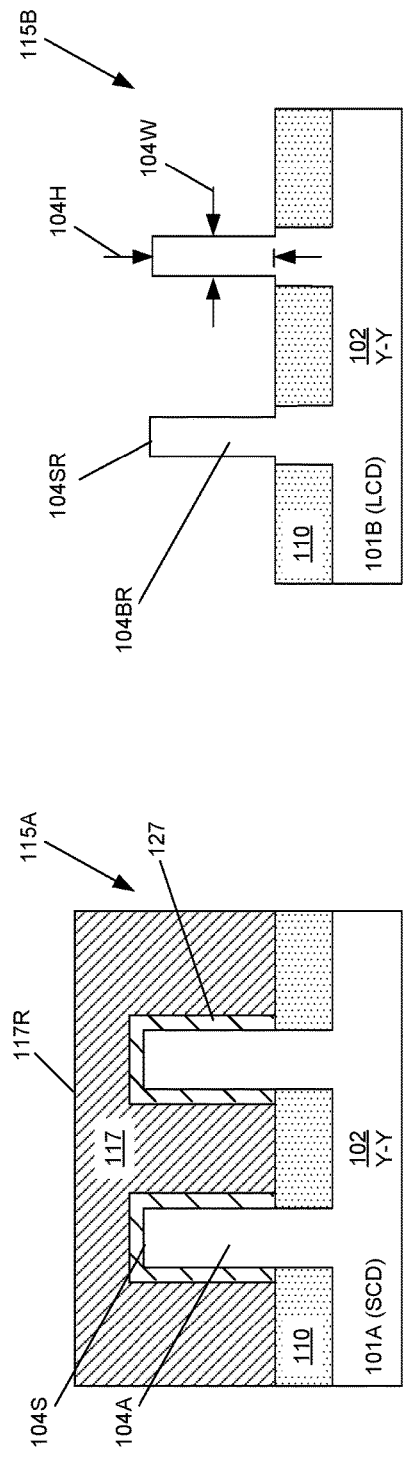
Fig. 18

US 10,074,732 B1

METHODS OF FORMING SHORT CHANNEL AND LONG CHANNEL FINFET DEVICES SO AS TO ADJUST THRESHOLD VOLTAGES

BACKGROUND OF THE INVENTION

1. Field of the Invention

The present disclosure generally relates to the fabrication of integrated circuits, and, more particularly, to various methods of forming short channel and long channel FinFET devices so as to adjust threshold voltages.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc.

A conventional FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure. FIG. 1 is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of fin-formation trenches 13, three illustrative fins 14, a gate structure 16, a sidewall spacer 18 and a gate cap layer 20. The spacer 18 is typically made of silicon nitride, but in some cases it may be made of a material having a lower dielectric constant (k) than that of silicon nitride. An insulating material 17, e.g., silicon dioxide, provides electrical isolation between the fins 14. The fins 14 have a three dimensional configuration: a height H, a width W and an axial length L. The axial length L corresponds to the gate length of the device, i.e., the direction of current travel in the device 10 when it is operational. The gate width of the device 10 is orthogonal to the gate length direction. The portions of the fins 14 covered by the gate structure 16 are the channel regions of the FinFET device 10. The portions of the fins 14 that are positioned outside of the spacers 18 will become part of the source/drain regions of the device 10.

In many integrated circuit products, FinFET devices are formed with different channel lengths (critical dimension) and with different threshold voltages (Vt) such that the FinFET devices exhibit different characteristics that permit product designers to produce integrated circuits that perform in a certain desired manner. For example, in some applications, integrated circuits are designed with a plurality of so-called short channel devices ("SCD") and a plurality of so-called long channel devices ("LCD"). The critical dimension or channel length of the long channel devices is typically greater than the channel length or critical dimension of the short channel devices and a short channel device typically has a threshold voltage that is less than the threshold voltage of a long channel device. Conversely, the off-state leakage current of a short channel device is typically greater than the off-state leakage current of a long channel device. In general, relative to the long channel devices, the short channel devices exhibit faster switching speeds and higher off-state leakage currents. Short channel devices are frequently employed in portions of an integrated circuit where fast switching speeds of the transistors is very important, e.g., the logic or computational circuits in an integrated circuit product, a section of the IC product where the switching speed of the transistors is more important than controlling the off-state leakage current of such transistors. In contrast, long channel devices are employed as circuit elements in circuits where the switching speed of the transistors is less important than their ability to exhibit low off-state leakage currents. For example, long channel devices may be employed in input/output circuits so as to reduce power consumption when the integrated circuit product is turned off.

In some applications, integrated circuit products are designed such that there is an intentional mismatch in the threshold voltages ("$V_t$ mis-match") of the SCD devices and the LCD devices formed on the product so as to permit the devices to be independently turned on and off. However, during fabrication, for any of a variety of different reasons, the actual $V_t$ mis-match on the actual devices is greater than the anticipated $V_t$ mis-match. This difference in the actual $V_t$ mis-match and the $V_t$ mis-match anticipated by the design process may result in the operational characteristics of the final integrated circuit product being less than anticipated by the design process.

The present disclosure is directed to various methods of forming short channel and long channel FinFET devices so as to adjust threshold voltages that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming short channel and long channel FinFET devices so as to adjust threshold voltages. One illustrative method disclosed herein includes, among other things, forming first and second fins for a short channel FinFET device ("SCD") and a long channel FinFET device ("LCD"), respectively, wherein a channel portion of each of the first and second fins has substantially a same initial size in terms of a vertical height and lateral width, and performing an oxidation process to form a sacrificial oxide material selectively on the channel portion of one of the first and second fins but not on the channel portion of the other of the first and second fins. In this example, the method also involves removing the sacrificial oxide material from the fin on which it is formed so as to produce a reduced-size channel portion on that fin that is less than the initial size of the channel portion of the other non-oxidized fin and forming first and second gate structures for the SCD and LCD devices.

BRIEF DESCRIPTION OF THE DRAWINGS

The disclosure may be understood by reference to the following description taken in conjunction with the accompanying drawings, in which like reference numerals identify like elements, and in which:

FIGS. 2-20 depict various novel methods disclosed herein for forming short channel and long channel FinFET devices so as to adjust threshold voltages.

Figure 1:
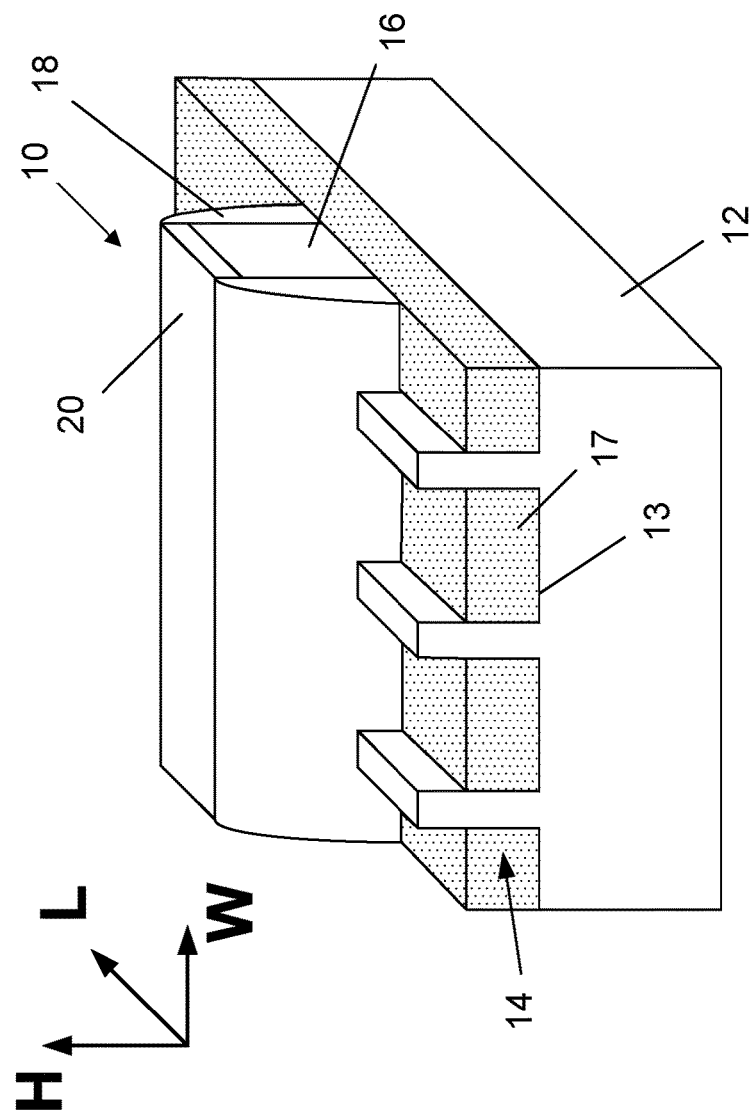
FIG. 1 is a simplistic depiction of an illustrative prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various novel methods of forming short channel and long channel FinFET devices so as to adjust threshold voltages. As will be readily apparent to those skilled in the art upon a complete reading of the present application, the present method is applicable to a variety of products, including, but not limited to, logic products, memory products, etc. With reference to the attached figures, various illustrative embodiments of the methods and devices disclosed herein will now be described in more detail.

Figure 2:
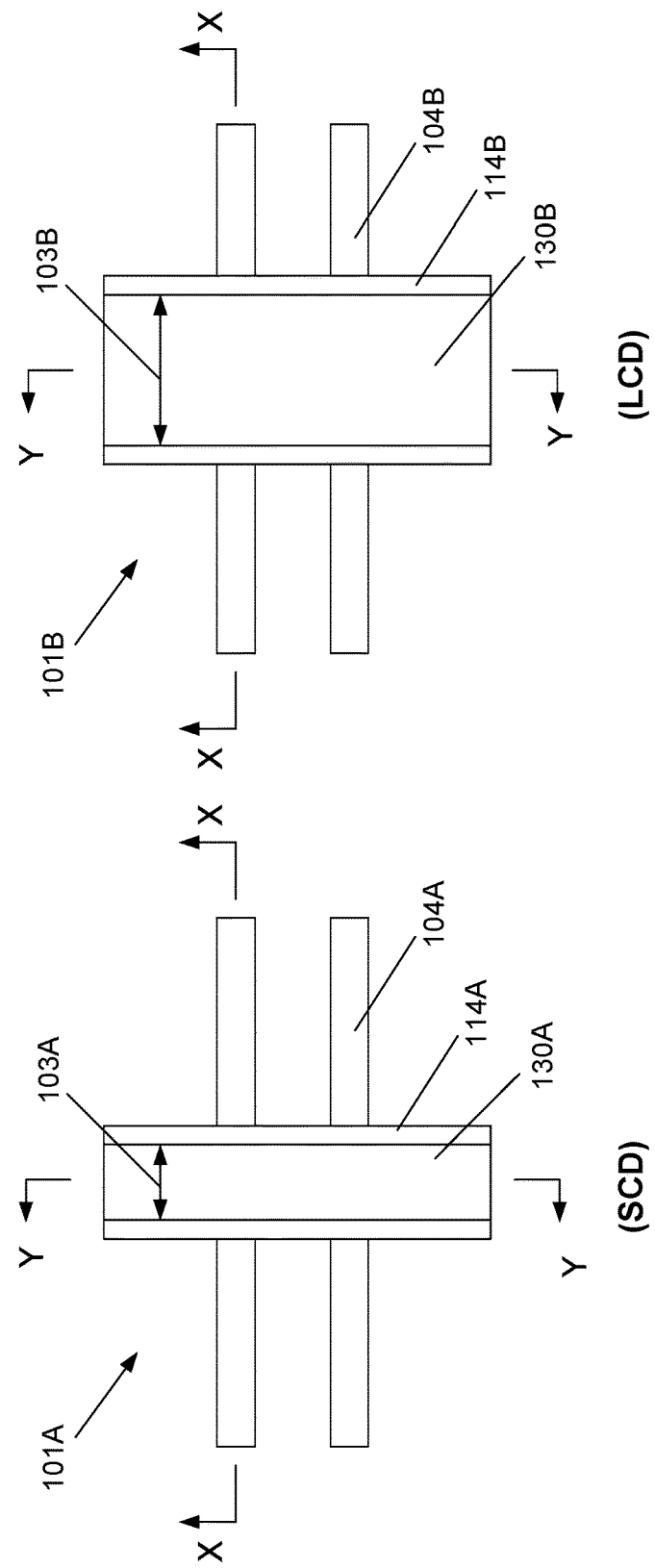

FIGS. 2-20 depict various novel methods disclosed herein for forming an integrated circuit product comprised of short channel FinFET devices 101A ("SCD") and long channel FinFET devices 101B ("LCD") so as to adjust threshold voltages of one of the devices. FIG. 2 is a simplistic plan view of an illustrative SCD device 101A and an illustrative LCD device 101B (collectively referred to by use of the reference numeral 101) to show where various cross-sectional views in the following drawings are taken. In the example depicted herein, the SCD device 101A and the LCD device 101B are each comprised of two illustrative fins 104A, 104B, respectively. Of course, the devices 101 may have any desired number of fins and the number of fins on each of the devices need not be the same, although that may be the case in some applications. As shown in FIG. 2, the devices 101A, 101B comprise a gate cap (130A, 130B, respectively) that is positioned over a gate structure (not shown) and a sidewall spacer (114A, 114B) that is positioned adjacent the gate structure. The devices 101 may be formed in spaced-apart areas of a semiconductor substrate 102. The fins 104A of the SCD device 101A have a gate length (critical dimension) 103A (as measured at mid-point of the fin 104A above a recessed upper surface 110R of a recessed layer of insulating material 110) that is less than a gate length (critical dimension) 103B of the fins 104B (as measured at the same relative location as the CD of the fin 104A) of the LCD device 101B. As used herein and in the attached claims, a short channel device (SCD) shall be understood to be a FinFET device having a channel gate length 103A equal to or less than 20 nm, while a long channel device (LCD) shall be understood to be a FinFET device with a channel gate length 103B equal to or greater than 80 nm, wherein the gate length of the channel of the fin 104A, 104B, the critical dimension of the fins 104, being measured in a direction corresponding to the current transport direction of the devices 101 and at a location that is the mid-point of the vertical height of the fins 104A, 104B above a recessed upper surface 110R of a recessed layer of insulating material 110. In the following drawings, the cross-sectional view X-X is taken through an illustrative fin (in the gate-length direction of the devices 101). The cross-sectional view Y-Y is taken through the gate structure of the devices 101 in a direction that corresponds to the gate-width direction of the devices 101. The SCD device 101A is shown on the left side of the drawings while the LCD device 101B is shown on the right side of the drawings.

The illustrative devices 101 will be formed in and above a semiconductor substrate 102. The transistor devices depicted herein may be either NMOS or PMOS transistors. In the example depicted herein, the gate structures of the devices 101 will be formed using well-known replacement gate processing techniques. Additionally, various doped regions, e.g., halo implant regions, doped source/drain regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

Figure 3:
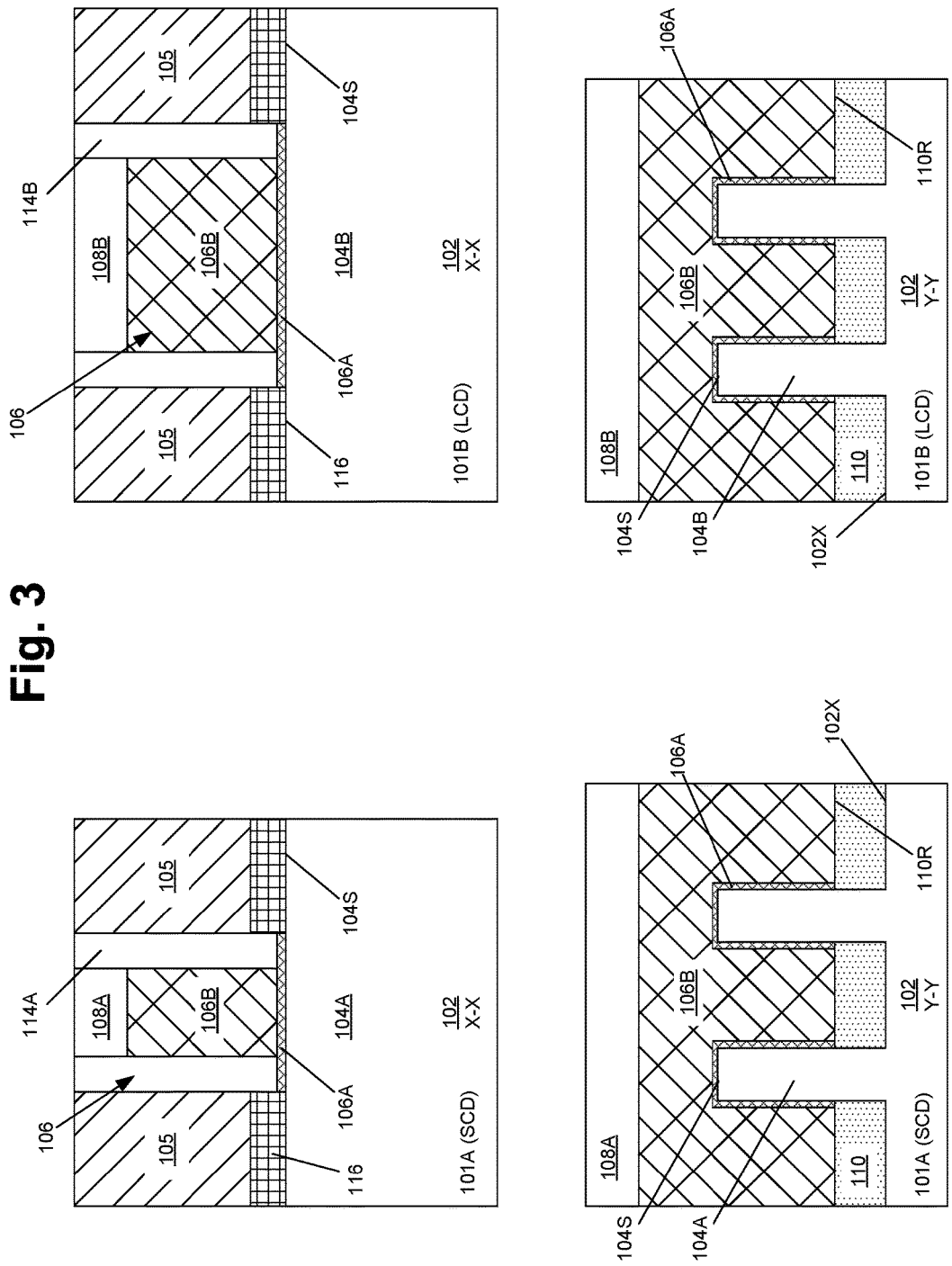

FIG. 3 depicts the devices 101 after several process operations were performed. First, one or more etching processes, e.g., anisotropic etching processes, were performed through a patterned fin-formation etch mask (not shown) to form a plurality of fin-formation trenches 102X and thereby define a plurality of fins 104A, 104B (collectively referred to by use of the reference numeral 104) across the substrate 102. The patterned fin-formation hard mask may be comprised of one or more layers of material and it may be formed to any desired overall thickness. As one example, the patterned fin-formation hard mask may be comprised of a relatively thin layer of silicon dioxide and a relatively thicker layer of silicon nitride.

With continuing reference to FIG. 3, at this point in the process flow, all of the fins 104 are substantially the same in terms of their physical size, i.e., the lateral width and vertical height of the fins 104. Of course, the lateral width and vertical height of the fins 104 may vary depending upon the particular application. Additionally, the overall size, shape and configuration of the fin-formation trenches 102X and the fins 104 may vary depending on the particular application. In the illustrative examples depicted in the attached drawings, the fin-formation trenches 102X and the fins 104 are all depicted as having a uniform size and shape. However, such uniformity in the size and shape of the trenches 102X and the fins 104 is not required to practice at least some aspects of the inventions disclosed herein. In the attached figures, the fin-formation trenches 102X are depicted as having been formed by performing an anisotropic etching process that results in the fins 104 having a schematically (and simplistically) depicted, generally rectangular configuration. In an actual real-world device, the sidewalls of the fins 104 may be somewhat outwardly tapered (i.e., the fins may be wider at the bottom of the fin than they are at the top of the fin) although that configuration is not depicted in the attached drawings. Thus, the size and configuration of the fin-formation trenches 102X and the fins 104, and the manner in which they are made, should not be considered a limitation of the present invention. For ease of disclosure, only the substantially rectangular trenches 102X and fins 104 will be depicted in the subsequent drawings.

With continuing reference to FIG. 3, after formation of the fins 104, a layer of insulating material 110 (e.g., silicon dioxide) was deposited so as to overfill the fin-formation trenches 102X. Thereafter, at least one process operation, such as a chemical mechanical polishing (CMP) process, was performed to planarize the upper surface of the layer of insulating material 110 with the upper surface 104S of the fins 104. Thereafter, a recess etching process was performed on the layer of insulating material 110 to reduce its thickness within the fin-formation trenches 102X such that it has a recessed upper surface 110R that is positioned at a level that is below the level of the upper surface 104S of the fins 104. Next, sacrificial gate structures 106 (comprised of a sacrificial gate insulation layer 106A and a sacrificial gate electrode 106B) and initial gate caps 108A, 108B (collectively referred to by use of the reference numeral 108) were formed for each of the devices 101. In one illustrative example, the sacrificial gate insulation layer 106A may be formed by performing an oxidation process so as to oxidize the exposed portions of the fins 104 above the recessed upper surface 110R of the layer of insulating material 110. At that point, the material for the sacrificial gate electrode 106B, e.g., amorphous silicon, polysilicon, etc., was blanket-deposited across the substrate 102 and its upper surface was subjected to a CMP process to planarize the upper surface of the deposited layer of material. Thereafter, the material for the gate caps 108, e.g., silicon nitride, was blanket-deposited across the substrate 102 above the layer of material for the sacrificial gate electrode 106B. At that point, a patterned etch mask layer (not shown) was formed above the layer of gate cap material. Then, an etching process was performed though the patterned etch mask so as to pattern the layer of gate cap material, thereby resulting in the gate caps 108A, 108B depicted in FIG. 3. Then, the patterned etch mask was removed and an etching process was performed through the patterned gate caps 108 to remove the exposed portions of the gate electrode material layer so as to result in the patterned sacrificial gate electrode structures 106B depicted in FIG. 3. As indicated, at this point in the process, the sacrificial gate insulation layer 106A remains positioned on the fins 104 in the portions of the fins 104 that are not covered by the sacrificial gate structures 106.

With continuing reference to FIG. 3, sidewall spacers 114A, 114B (collectively referred to by use of the reference numeral 114) were formed adjacent the entire perimeter of the sacrificial gate structures 106 on the devices 101A, 101B, respectively. The sidewall spacers 114 may be formed by depositing a conformal layer of spacer material (not shown) above the substrate 102 and thereafter performing an anisotropic etching process to remove horizontally positioned portions of the layer of spacer material. The spacers 114 may be of any desired thickness (as measured at their base) and they may be comprised of a variety of different materials, e.g., silicon nitride, SiNC, SiN, SiCO, and SiNOC, etc. After the spacers 114 were formed, an etching process was performed to remove the exposed portions of the sacrificial gate insulation layer 106A not covered by the sidewall spacers 114 so as to expose portions of the fins 104 not covered by the sacrificial gate structures 106 and the spacers 114. Then, an epi semiconductor material 116 was formed on the exposed portions of the fins 104 by performing an epitaxial growth process. The epi material 116 may be formed to any desired thickness. However, it should be understood that the epi material 116 need not be formed in all applications. Next, a layer of insulating material 105 was blanket-deposited on the devices 101 so as to overfill the openings above the epi material 116. At that point, a CMP process was performed to planarize the layer of insulating material 105 using the gate caps 108 as a polish stop layer. The layer of insulating material 105 may be made from a variety of insulating materials, e.g., silicon dioxide, SiCO, a low-k material (k value of 8 or less), etc.

Figure 4:
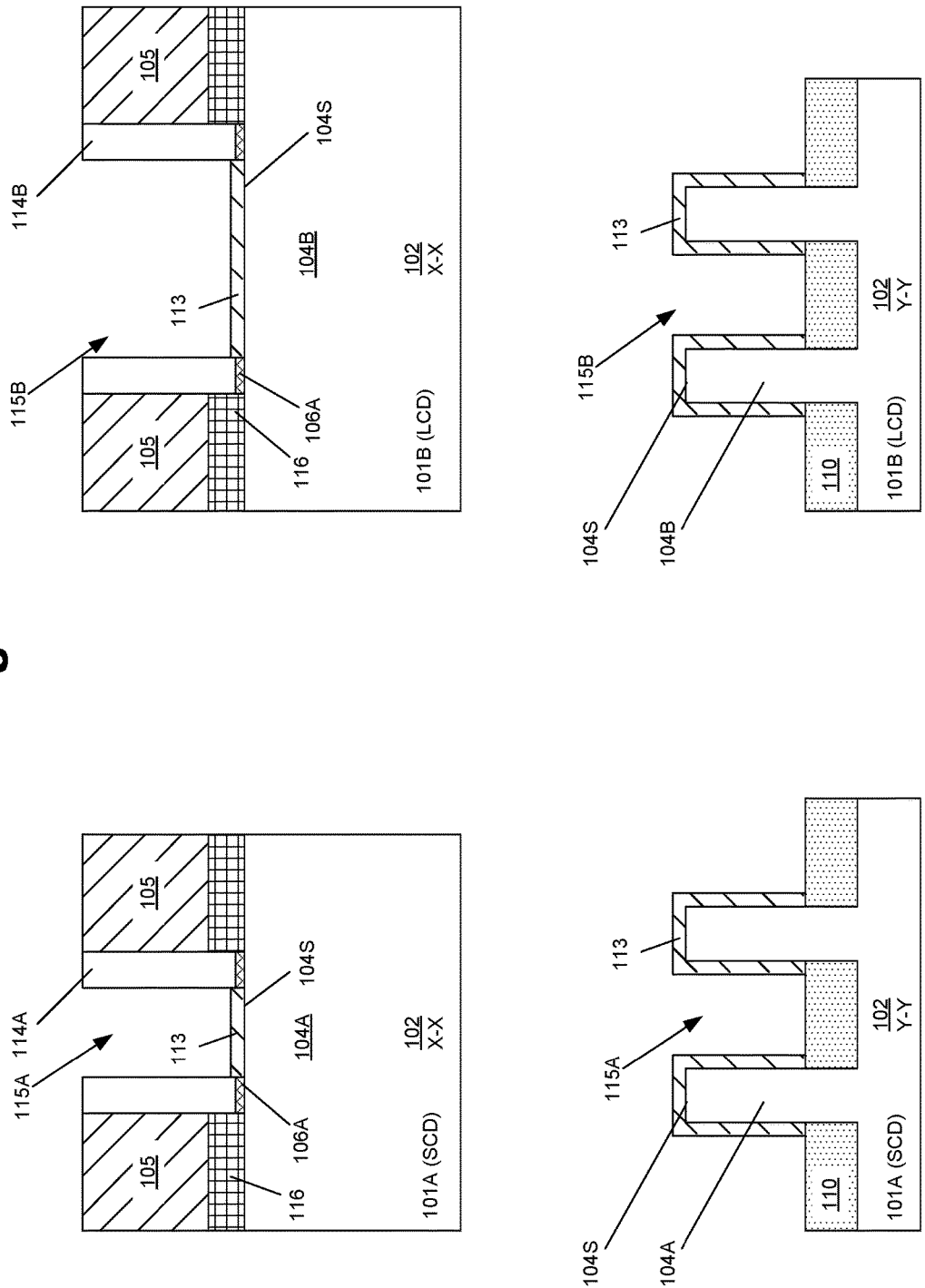

FIG. 4 depicts the devices 101 after several process operations were performed. First, a CMP process was performed to remove the gate caps 108 on the devices 101 and thereby expose the gate structures 106 on the devices 101. Then, one or more etching processes were performed to remove the exposed portions of the gate structures 106 within the spacers 114 so as to expose the upper surface 104S of the fins 104 on both of the devices 101. These process operations result in the formation of replacement gate cavities 115A, 115B (collectively referred to by use of the reference numeral 115) on the devices 101A, 101B, respectively. Thereafter, an oxidation process was performed to form an LCD gate insulation layer 113 that is tailored for the LCD device 101B within the gate cavities 115 of both the SCD device 101A and the LCD device 101B. Of course, as will be understood by those skilled in the art, not all of the LCD devices 101B on an integrated circuit product need to include the LCD gate insulation layer 113, i.e., some of the LCD devices 101B may be formed without the LCD gate insulation layer 113. However, at this stage of fabrication, the LCD gate insulation layer 113 is formed on all of the LCD devices 101B and all of the SCD devices 101A formed on the substrate 102. As shown more fully below, the LCD gate insulation layer 113 will be removed from all of the SCD devices 101A. The LCD gate insulation layer 113 may remain in place on some of the completed LCD devices 101B while it may be removed from selected ones of the LCD devices 101B as dictated by the requirements of the circuits formed on the IC product. The LCD gate insulation layer 113 may be comprised of a variety of materials, e.g., silicon dioxide, hafnium oxide, a material having a dielectric constant (k) of 10 or greater, etc., and it may be formed to any desired thickness, e.g., 2-3 nm. In general, the LCD gate insulation layer 113 will have a greater thickness than is desired for the SCD device 101A such that the LCD device 101B exhibits very low off-state leakage currents. In contrast, the gate insulation layer for the SCD device 101A will tend to be thinner such that the SCD device 101A exhibits very fast switching speeds.

Figure 5:
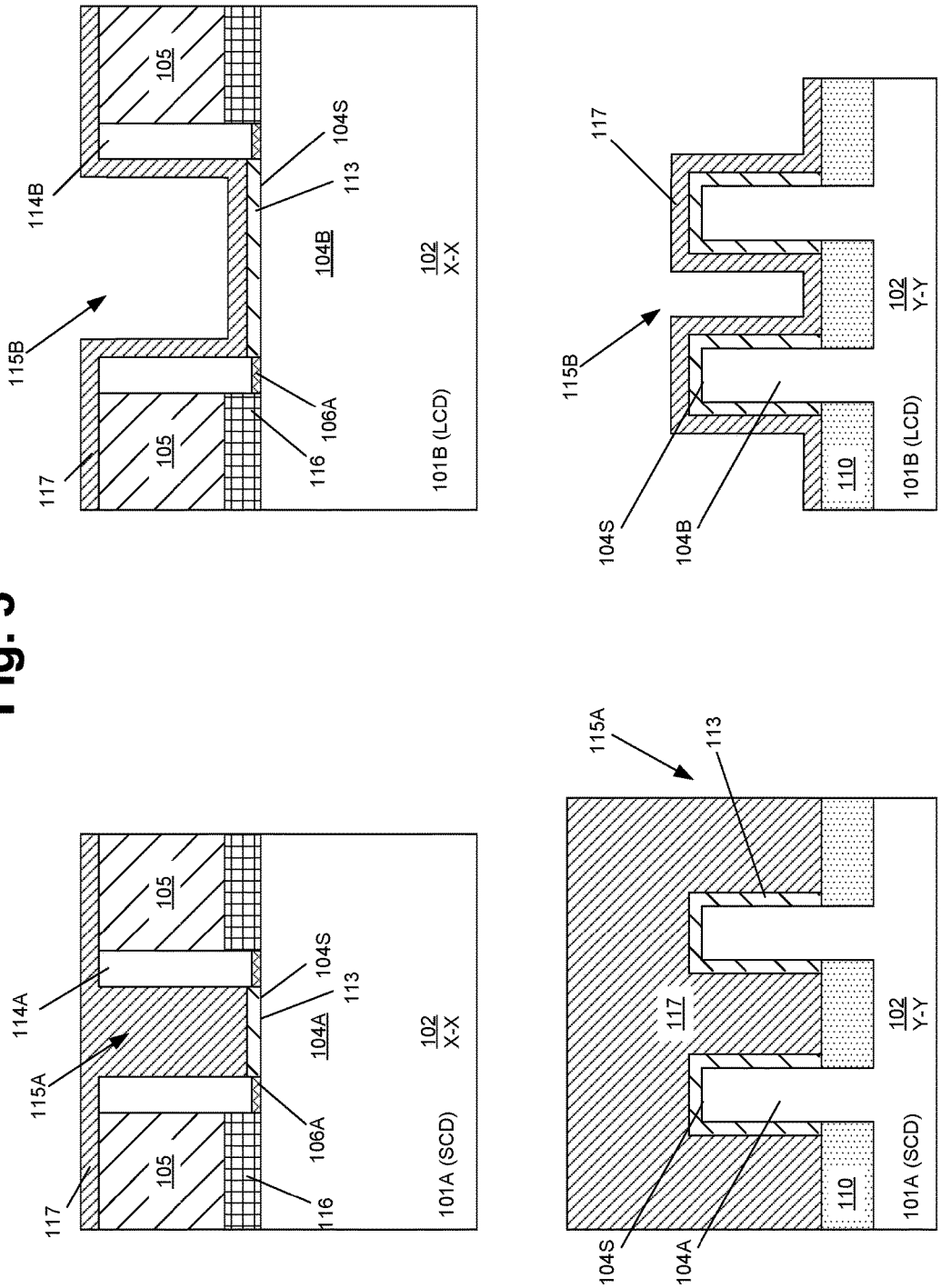

FIG. 5 depicts the devices 101 after a conformal sacrificial protection layer 117 comprised of a substantially non-oxidizable material was formed on the devices 101 by performing a conformal deposition process, e.g., a conformal ALD deposition process. The sacrificial protection layer 117 may be comprised of a variety of different materials that will substantially not oxidize when exposed to an oxidation process, such as, for example, a metal-containing material, a metal compound, TiN, TaN, etc., that may be selectively etched relative to the LCD gate insulation layer 113 and the surrounding materials, as discussed more fully below. The thickness of the sacrificial protection layer 117 (as measured at locations above the planar upper surface of the insulating material 105) may also vary depending upon the particular application, e.g., 10-20 nm. As depicted, due to the smaller gate length 103A (see FIG. 2) and physically narrower replacement gate cavity 115A of the SCD device 101A, the sacrificial protection layer 117 essentially pinches-off and substantially fills the replacement gate cavity 115A on the SCD device 101A. In contrast, due to the larger gate length 103B (see FIG. 2) and physically wider replacement gate cavity 115B of the LCD device 101B, the sacrificial protection layer 117 forms conformally within the replacement gate cavity 115B on the LCD device 101B.

Figure 6:
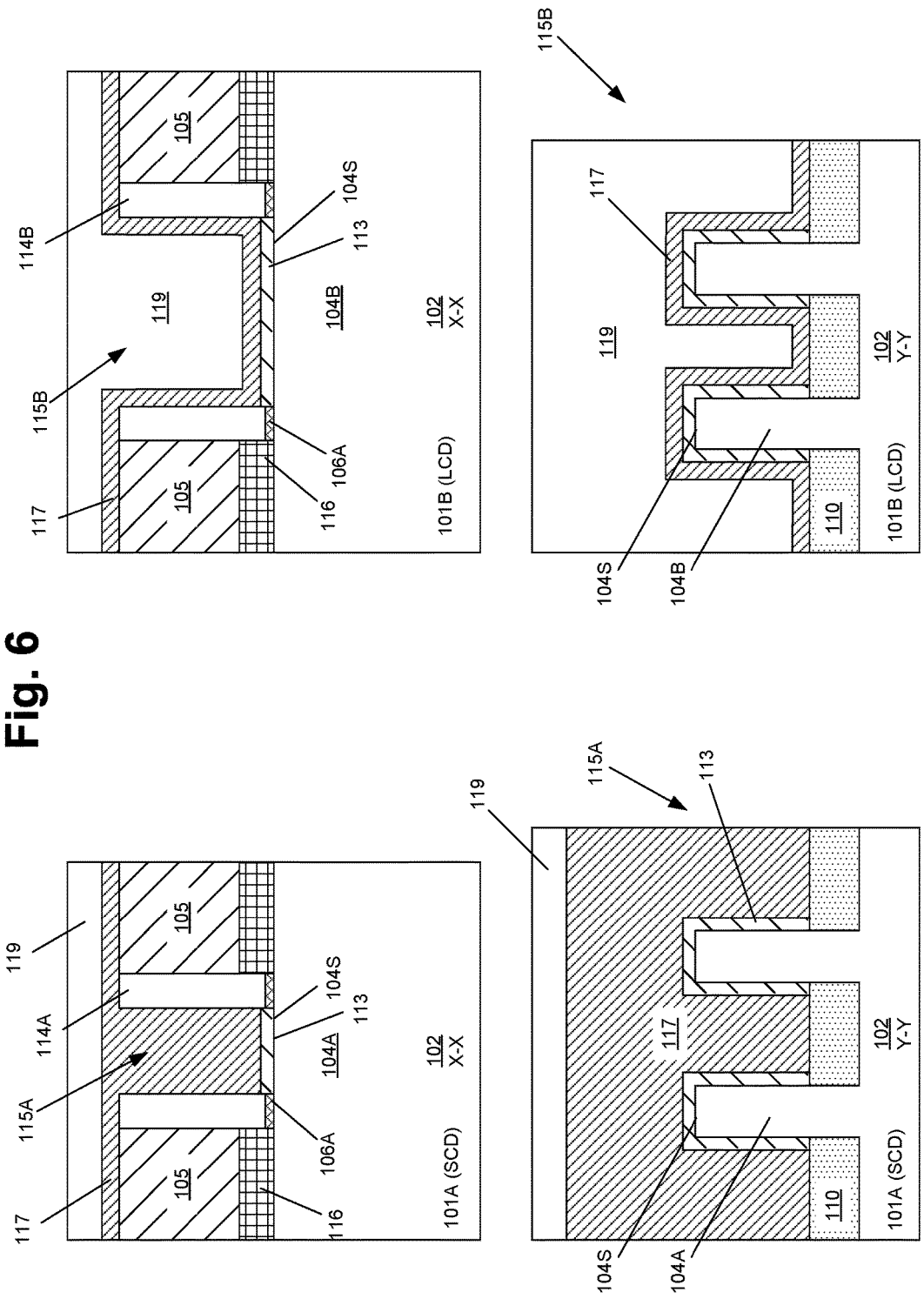

FIG. 6 depicts the devices 101 after a layer of masking material 119, e.g., OPL, was formed above the devices 101. As depicted, the masking material 119 overfills the replacement gate cavity 115B on the LCD device 101B.

Figure 7:
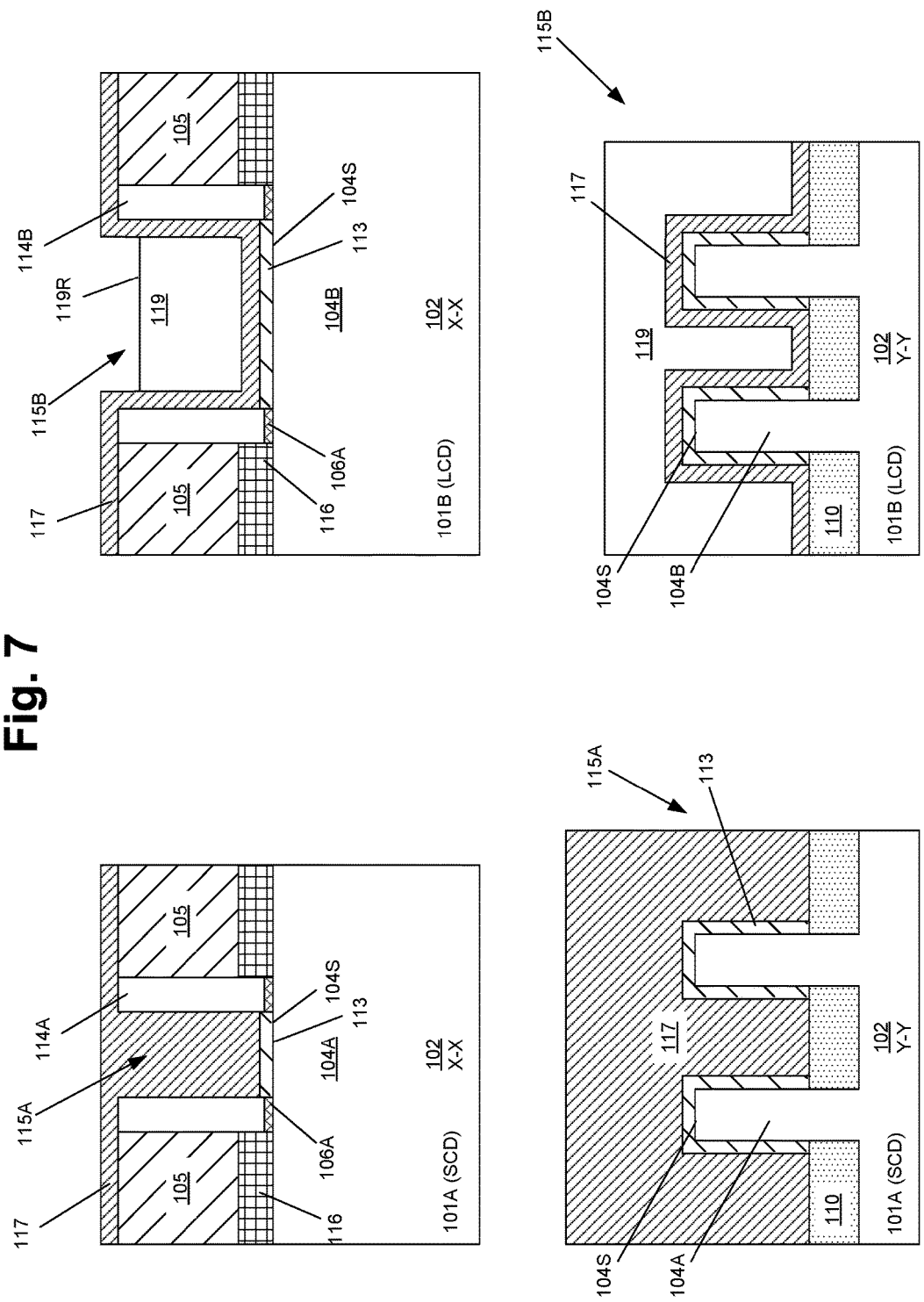

FIG. 7 depicts the devices 101 after a recess etching process was performed on the masking material 119 such that it has a recessed upper surface 119R. This process operation exposes all of the sacrificial protection layer 117 on the SCD device 101A, while a portion of the masking material 119 remains positioned in the replacement gate cavity 115B of the LCD device 101B above a portion of the sacrificial protection layer 117

Figure 8:
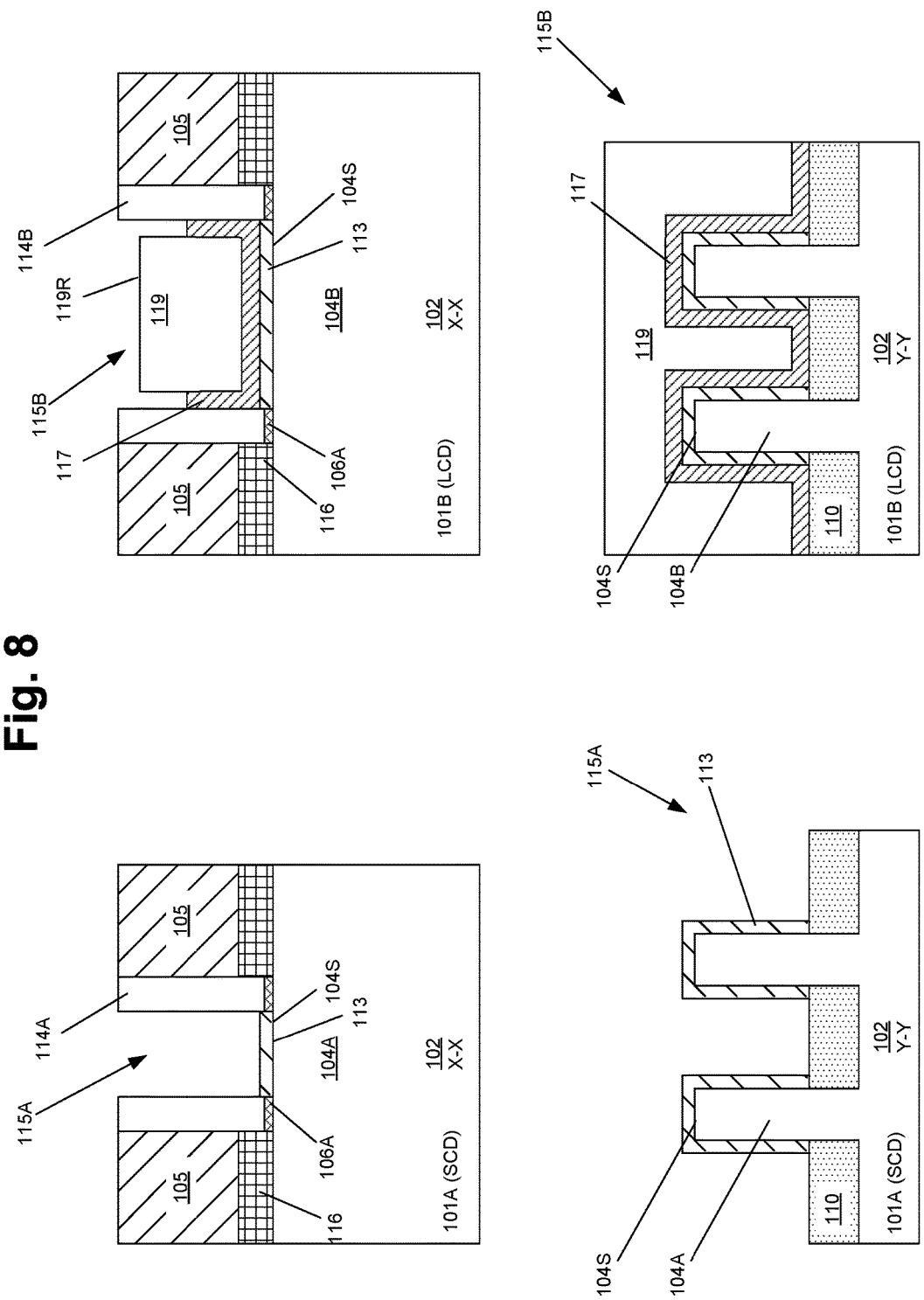

FIG. 8 depicts the devices 101 after an etching process was performed to remove all of the sacrificial protection layer 117 from the SCD device 101A, while leaving portions of the sacrificial protection layer 117 within the replacement gate cavity 115B on the LCD device 101B. As depicted, this process operation exposes the LCD gate insulation layer 113 within the replacement gate cavity 115A on the SCD device 101A.

Figure 9:
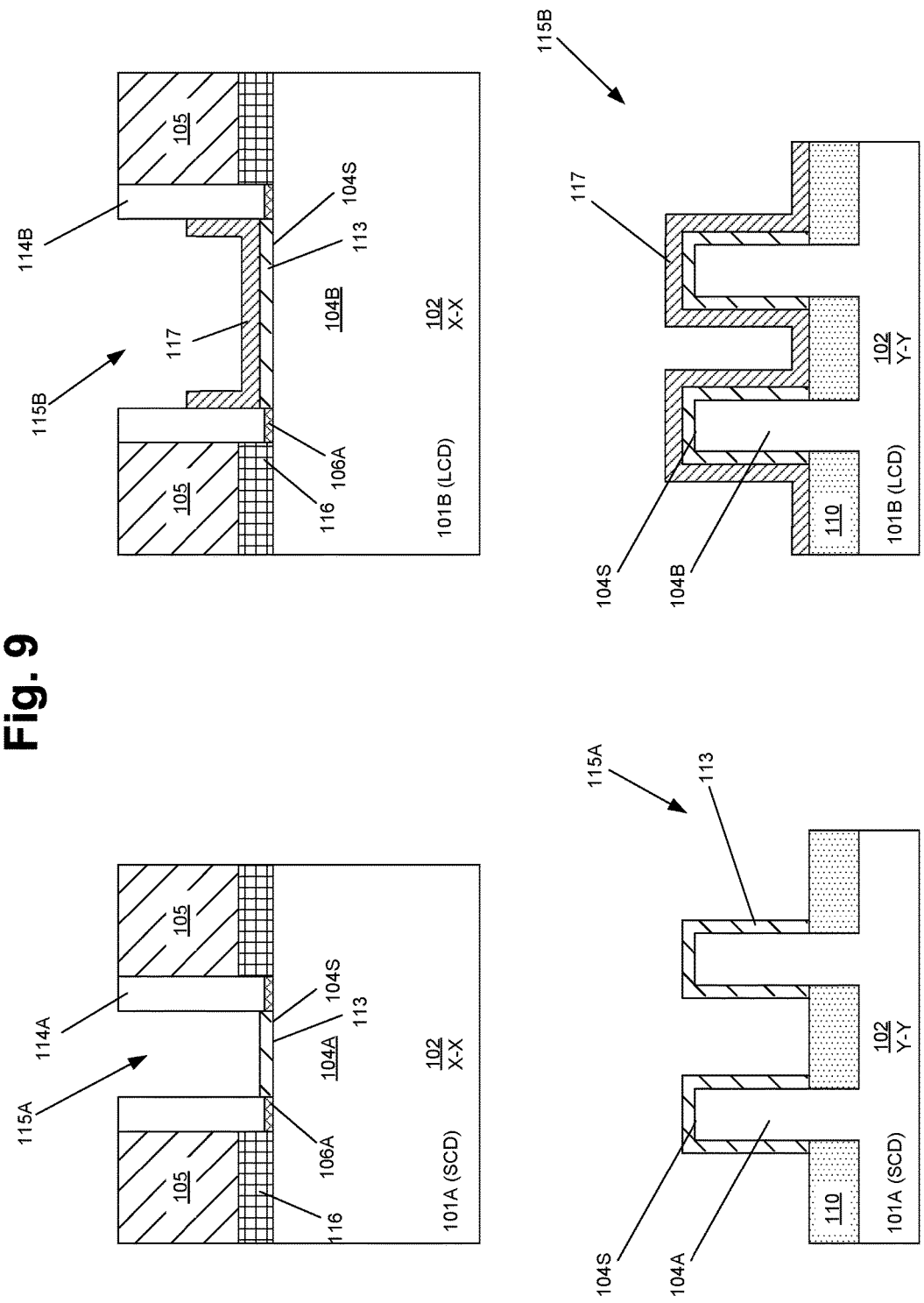

FIG. 9 depicts the devices 101 after an etching process was performed to remove the remaining portions of the masking material 119 positioned in the replacement gate cavity 115B on the LCD device 101B. This process operation exposes the remaining portions of the sacrificial protection layer 117 positioned in the replacement gate cavity 115B on the LCD device 101B.

Figure 10:
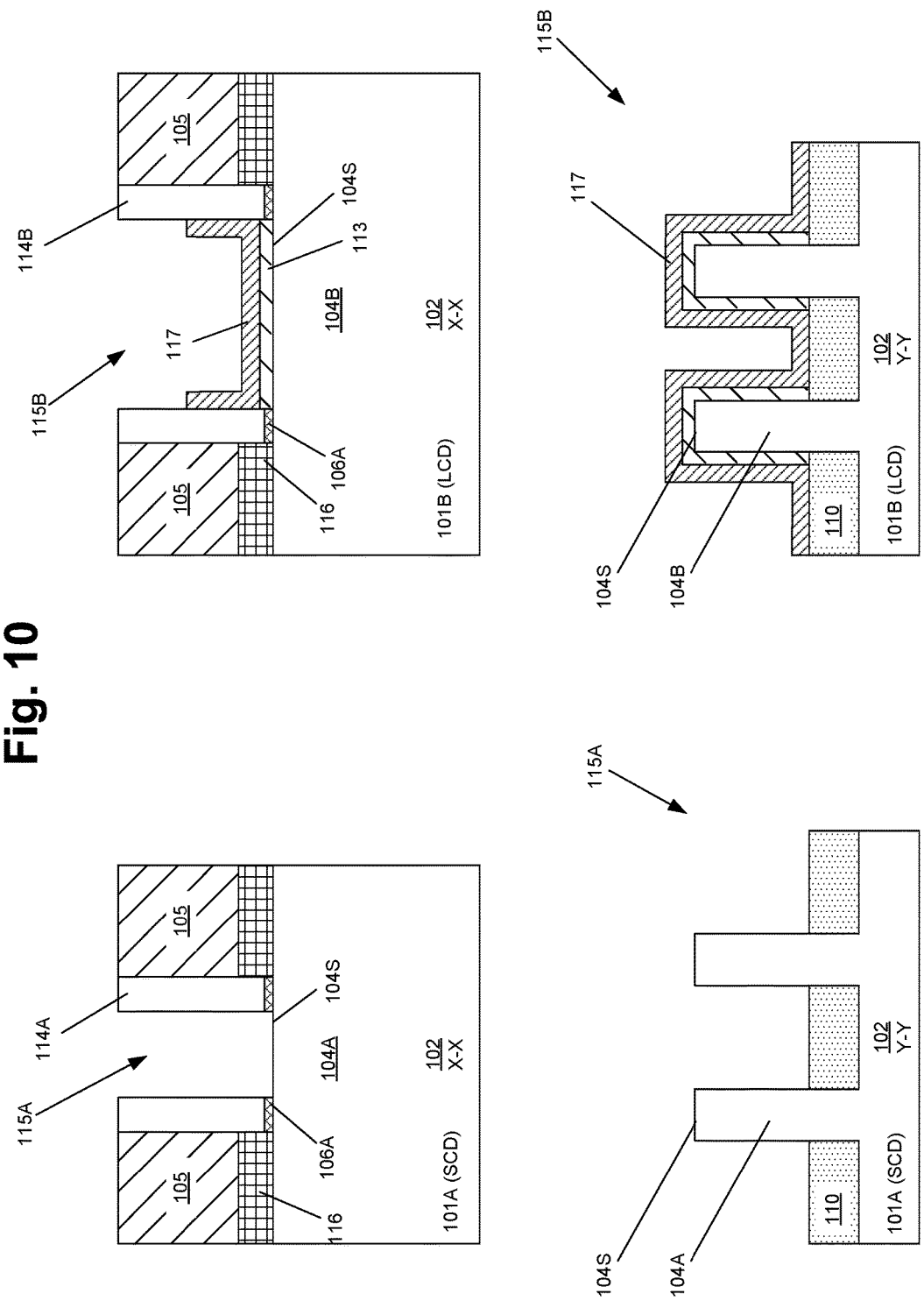

FIG. 10 depicts the devices 101 after an etching process was performed to remove the LCD gate insulation layer 113 within the replacement gate cavity 115A on the SCD device 101 and thereby expose the upper surface 104S of the fin 104A on the SCD device 101A. The remaining portion of the sacrificial protection layer 117 within the replacement gate cavity 115B on the LCD device 101B protects the LCD gate insulation layer 113 within the replacement gate cavity 115B on the LCD device 101B during this etching process.

Figure 11:
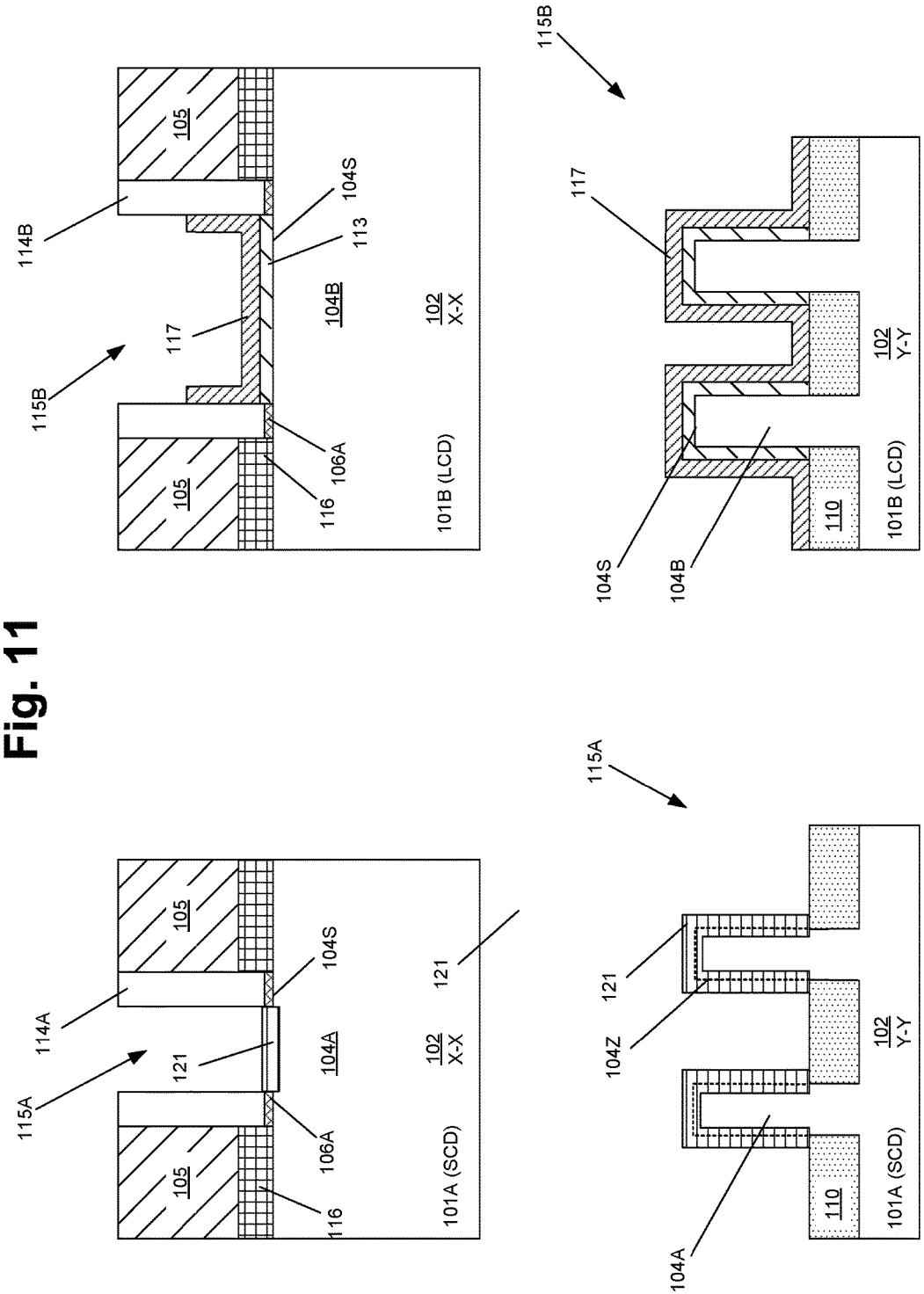

FIG. 11 depicts the devices 101 after an oxidation process was performed to form a sacrificial layer of silicon dioxide 121 on the fins 104A exposed within the replacement gate cavity 115A on the SCD device 101A. Note that the remaining portions of the sacrificial protection layer 117 does not oxidize during this oxidation process and it protects the underlying LCD gate insulation layer 113 formed on the LCD device 101B during this oxidation process. During the formation of the oxidation layer 121, portions of the fins 104A will be consumed, i.e., the oxidized portion of the fins 104A exposed within the replacement gate cavity 115A will be reduced in size. As shown in view Y-Y for the SCD device 101A, a dashed line 104Z simplistically depicts the original size of the fins 104A prior to performing the oxidation process. The amount of the size-reduction of the fins 104A may vary depending upon the particular application and it may be controlled by controlling the oxidation process and the thickness of the oxidation layer 121. Thus, device designers can control the final size (e.g., height and width) of the portions of the fins 104A in the channel regions of the SCD device 101A relative to the final size (e.g., height and width) of the fins 104B in the channel region of the LCD device 101B.

Figure 12:
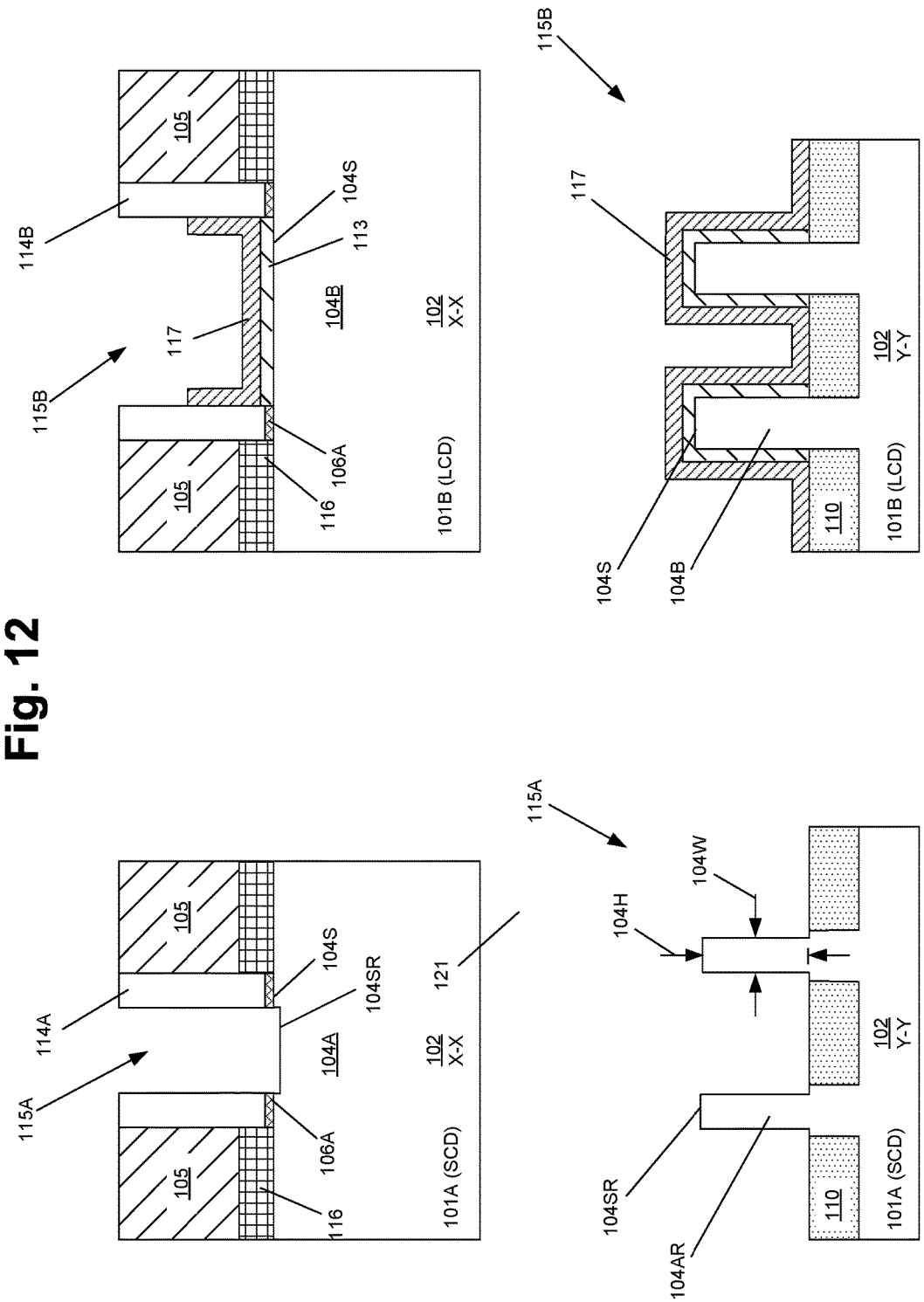

FIG. 12 depicts the devices 101 after an etching process was performed to remove the sacrificial oxidation layer 121 within the replacement gate cavity 115A on the SCD device 101 so as to expose reduced-size fins 104AR in the channel region of the SCD device 101A having a recessed upper surface 104SR. The remaining portion of the sacrificial protection layer 117 within the replacement gate cavity 115B on the LCD device 101B protects the LCD gate insulation layer 113 within the replacement gate cavity 115B on the LCD device 101B during this etching process. As depicted, the reduced-size fins 104AR have a reduced lateral width 104W (measured at a mid-point of the fins 104AR above the upper surface of the insulating material 110) and a reduced vertical height 104H as compared to the corresponding dimension of the fins 104B in the channel region of the LCD device 101B. The ability to decrease the size of the fins 104AR on the SCD device 101A permits device designers to "tune" the threshold voltage of the SCD device 101A. For example, in some applications, integrated circuits may be designed such that there is an intentional mismatch in the threshold voltages ("$V_t$ mis-match") of the SCD devices and the LCD devices formed on the IC product. However, during fabrication, for any of a variety of different reasons, the actual $V_t$ mis-match on the actual devices is greater than the anticipated $V_t$ mis-match. As one example, reducing the lateral width 104W of the reduced-size fins 104AR by approximately 1 nm can increase the threshold voltage on the SCD device 101A by approximately 20 mV. Accordingly, depending upon the difference between the actual $V_t$ mis-match and the anticipated $V_t$ mis-match, the fins 104A on the SCD device 101A may be reduced in size or "trimmed" so as to achieve the desired anticipated $V_t$ mis-match between the SCD devices and the LCD devices.

As a simplistic example, assuming that the difference between the actual $V_t$ mis-match on the actual devices is 30 mV, then the anticipated $V_t$ mis-match and the threshold voltage of the SCD device 101A is less than anticipated by the design process. In that case, the width 104W of the fins 104AR may be reduced by about 1.5 nm so as to increase the threshold voltage of the SCD device 101A, thereby increasing the threshold voltage of the SCD device by about 30 mV and achieving the desired and anticipated $V_t$ mis-match between the SCD device 101A and the LCD device 101B.

Figure 13:
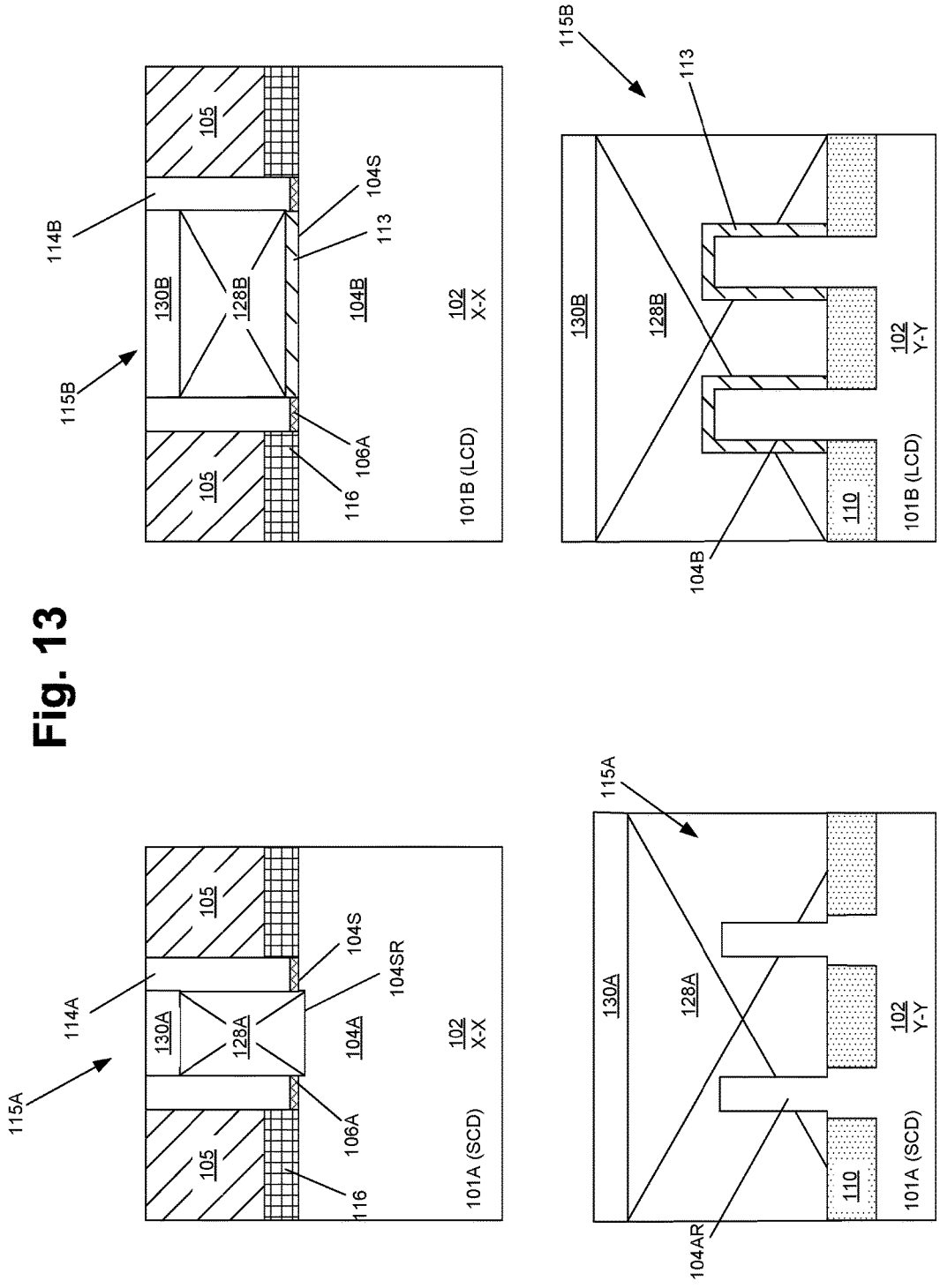

FIG. 13 depicts the devices 101 after several process operations were performed. First, an etching process was performed to remove the remaining portions of the sacrificial protection layer 117 from within the replacement gate cavity 115B on the LCD device 101B. This process operation exposes the LCD gate insulation layer 113 within the replacement gate cavity 115A on the SCD device 101A. At this point in the process flow, an etching process is performed to remove the LCD gate insulation layer 113 from all of the SCD devices formed for the product. If desired, the LCD gate insulation layer 113 may be removed from selected ones of groups of the LCD devices 101B while leaving the LCD gate insulation layer 113 in position in other of the LCD devices 101B, as dictated by the requirements of the circuits formed on the IC product. The LCD gate insulation layer 113 may be selectively removed from some of the LCD devices 101B by forming an appropriate masking layer that exposes the portions of the LCD gate insulation layer 113 that are desired to be removed (from all of the SCD devices and at least some of the LCD devices) and thereafter performing an etching process. In the example shown in FIG. 13, the LCD gate insulation layer 113 remains in position on the LCD device 101B. Thereafter, simplistically depicted replacement (final) gate structures 128A, 128B (collectively referred to by use of the reference numeral 128) and final gate caps 130A, 130B (collectively referred to by use of the reference numeral 130) were formed in the replacement gate cavities 115A, 115B for the devices 101A, 101B, respectively, using well-known manufacturing techniques. The LCD gate insulation layer 113 will be part of the replacement gate structure 128B for the depicted LCD device 101B, in this example. However, the other materials that constitute the replacement gate structures 128A, 128B may not be the same materials in the gate structures 128A, 128B, although that may be the case in some applications. Typically, the materials for the replacement gate structures 128 are sequentially formed in the gate cavities 115. For example, a first conformal deposition process may be performed to form a gate insulation layer (not shown) in the gate cavities 115 followed by performing a second conformal deposition process to form a work function adjusting metal layer (not shown) such as, e.g., titanium nitride, TiC, TiAlC, W, Al, etc., depending upon the type of device (N or P) being manufactured), on the gate insulation layer in the gate cavities 115. Thereafter, a blanket deposition process may be performed to form a bulk conductive material (not shown, e.g., tungsten, aluminum, polysilicon, etc) on the work function adjusting metal layer so as to over-fill the remaining portion of the gate cavities 115. Thereafter, one or more CMP processes was performed so as to remove excess portions of the gate insulation layer, the work function adjusting metal layer and the bulk conductive material that are positioned above the layer of insulating material 105 and outside of the gate cavities 115. At that point, one or more recess etching processes were performed to recess the vertical height of the materials of the replacement gate structures 128 so as to make room for the gate caps 130. The gate caps 130 may be formed by blanket depositing a layer of the material for the gate caps 130 above the devices and in the space above the recessed gate materials for the gate structures 128. At that point, another CMP process may be performed using the layer of insulating material 105 as a polish-stop so as to remove excess amounts of the material for the gate caps 130. At this point in the processing, the replacement gate structures 128 with gate caps 130 have been formed on the IC product. Of course, the materials of construction for the replacement gate structures 128 may vary depending upon whether the device is an N-type device or a P-type device. Additionally, the replacement gate structures 128 may have a different number of layers of material depending upon the type of device under construction, e.g., the replacement gate structure 128 for an N-type device may comprise more layers of conductive material than are present in a replacement gate structure 128 for a P-type device. The gate insulation layer may be comprised of a variety of different materials, such as, for example, silicon dioxide, a so-called high-k (k greater than 10) insulation material (where k is the relative dielectric constant), etc. The gate caps 130 may be made of a variety of different materials, e.g., silicon nitride, SiCN, SiN/SiCN, SiOC, SiOCN, etc.

Figure 14:
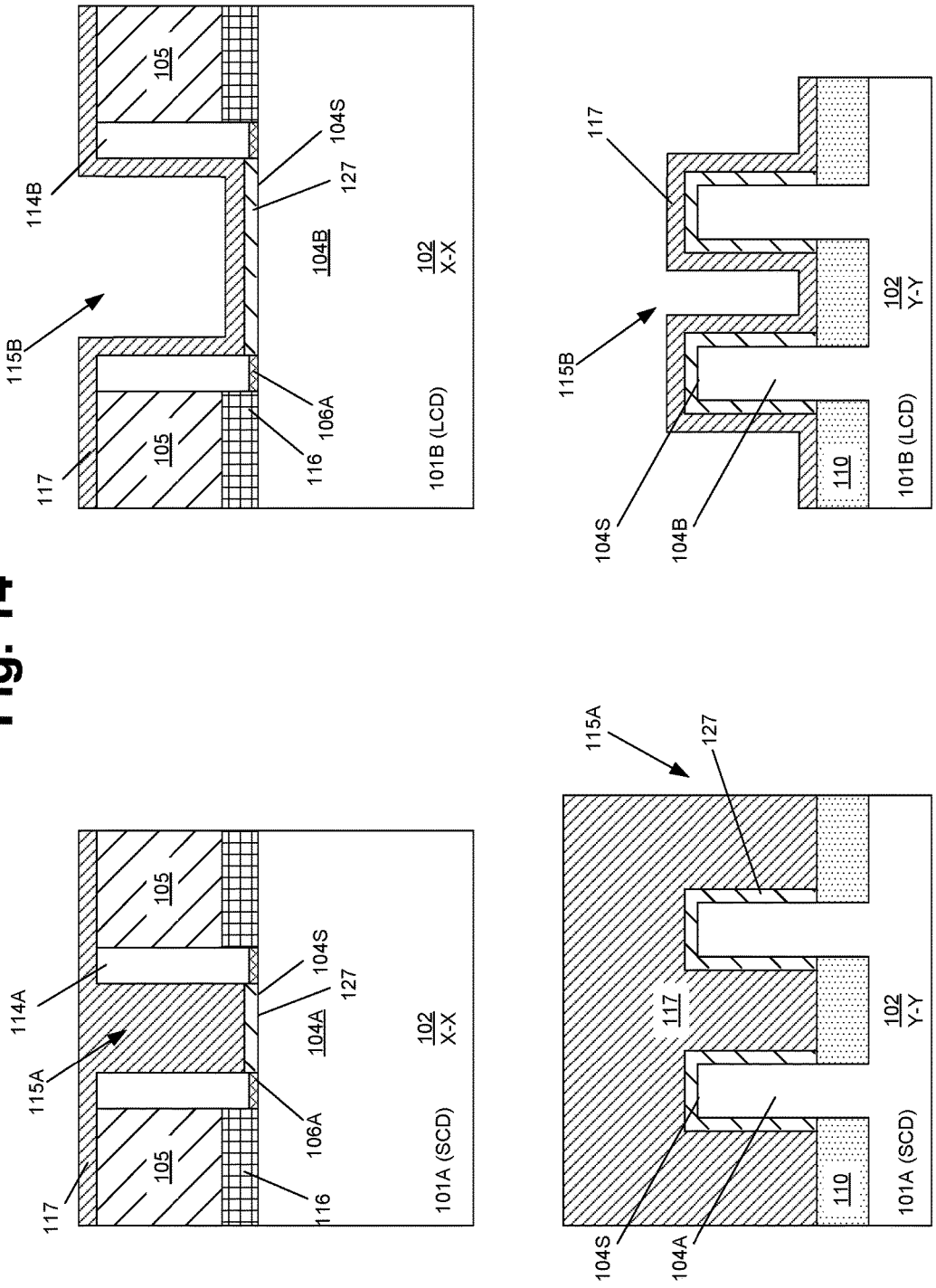

FIGS. 14-20 depict an alternative process flow for forming the SCD and LCD devices 101. Relative to the previous embodiment, in this embodiment, the size of the fins 104B in the channel region of the LCD device 101B will be reduced in size as compared to the size of the fins 104A in the channel region of the SCD device 101A. FIG. 14 depicts the devices 101 at a point in processing that generally corresponds to that shown in FIG. 5. However, in this embodiment, instead of forming the above-described LCD gate insulation layer 113 on all of the devices 101, a sacrificial gate insulation layer 127 is initially formed on all of the devices 101. Thereafter, the above-described sacrificial protection layer 117 was formed on all of the devices 101 above the sacrificial gate insulation layer 127. As before, the sacrificial protection layer 117 essentially pinches-off and substantially fills the narrower replacement gate cavity 115A on the SCD device 101A but forms conformally within the relatively wider replacement gate cavity 115B on the LCD device 101B. The sacrificial gate insulation layer 127 may be made of any desired material, e.g., silicon dioxide, and it may be formed to any desired thickness. As shown more fully below, the sacrificial gate insulation layer 127 will be removed from all of the devices 101 prior to the formation of the gate structures 128.

Figure 15:
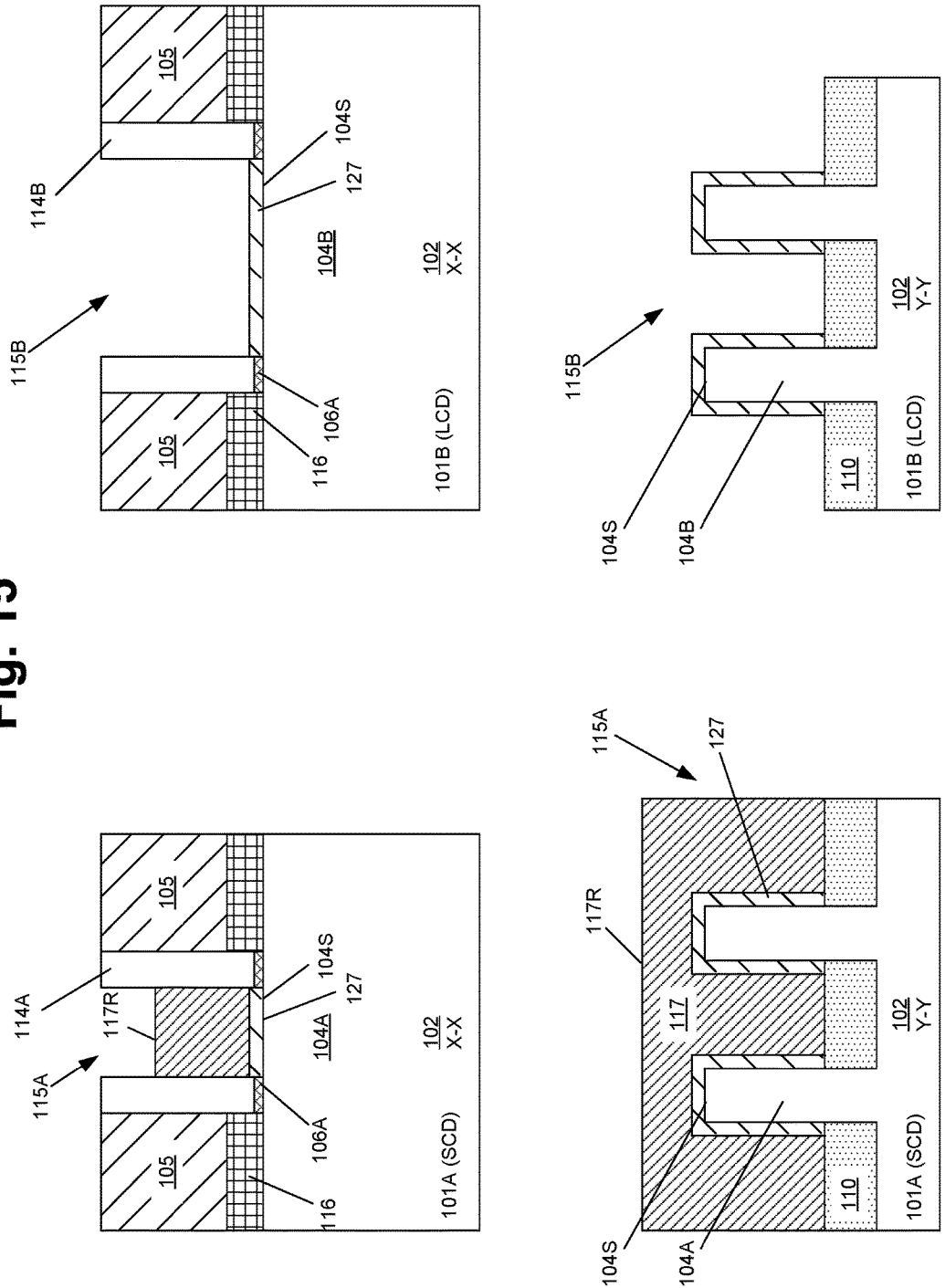

FIG. 15 depicts the devices 101 after a recess etching process was performed on the sacrificial protection layer 117 such that it has a recessed upper surface 117R. This recess etching process removes all of the sacrificial protection layer 117 from the LCD device 101B, while leaving portions of the sacrificial protection layer 117 within the replacement gate cavity 115A on the SCD device 101A. As depicted, this process operation exposes the sacrificial gate insulation layer 127 within the replacement gate cavity 115B on the LCD device 101B. The sacrificial protection layer 117 remains positioned above the sacrificial gate insulation layer 127 on the SCD device 101A.

Figure 16:
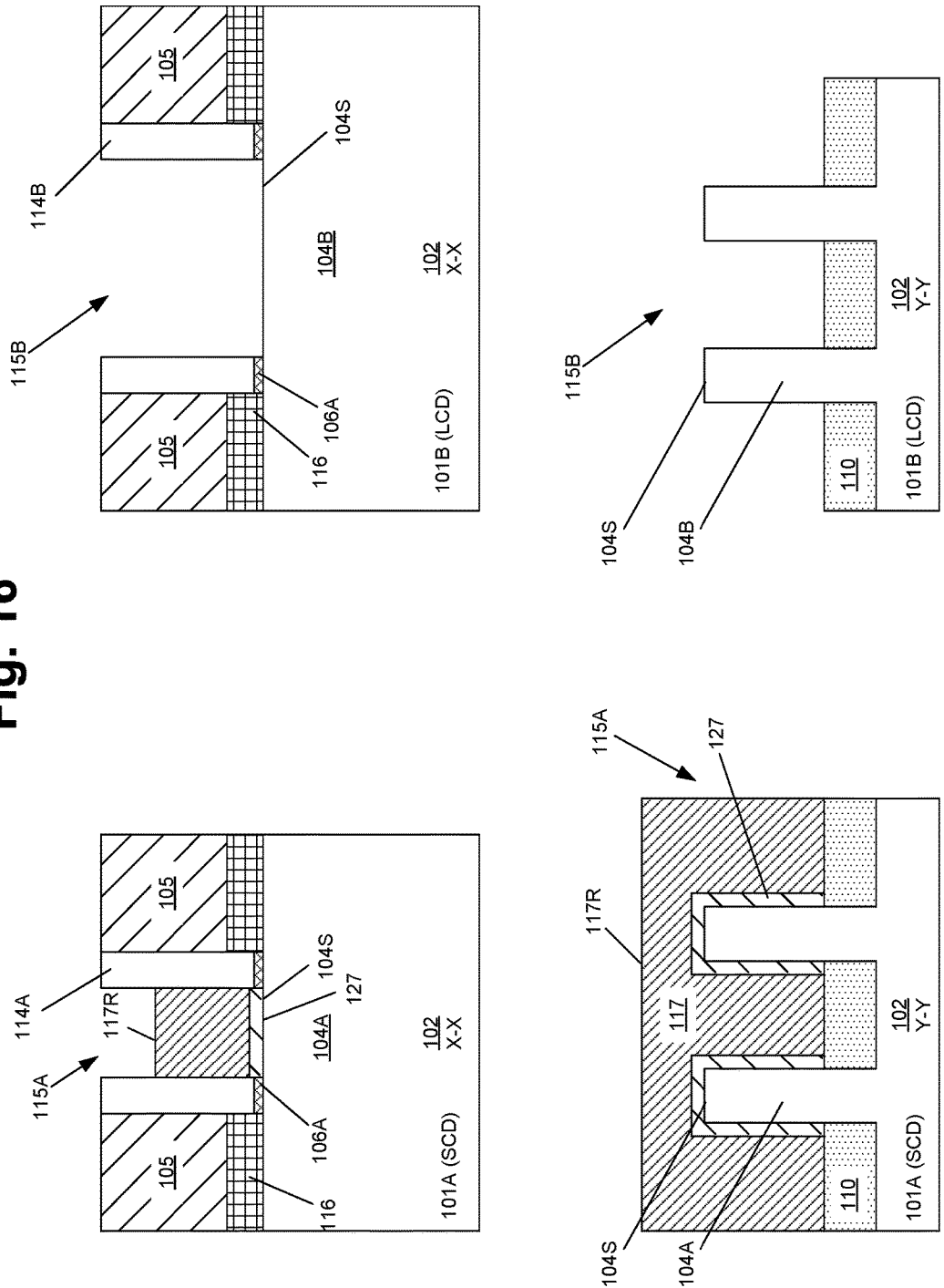

FIG. 16 depicts the devices 101 after an etching process was performed to remove the exposed portions of the sacrificial gate insulation layer 127 within the replacement gate cavity 115B on the LCD device 101B so as to thereby expose the upper surface 104S of the fin 104B on the LCD device 101B. The remaining portion of the sacrificial protection layer 117 within the replacement gate cavity 115A on the SCD device 101A protects the sacrificial gate insulation layer 127 within the replacement gate cavity 115A on the SCD device 101A during this etching process.

Figure 17:
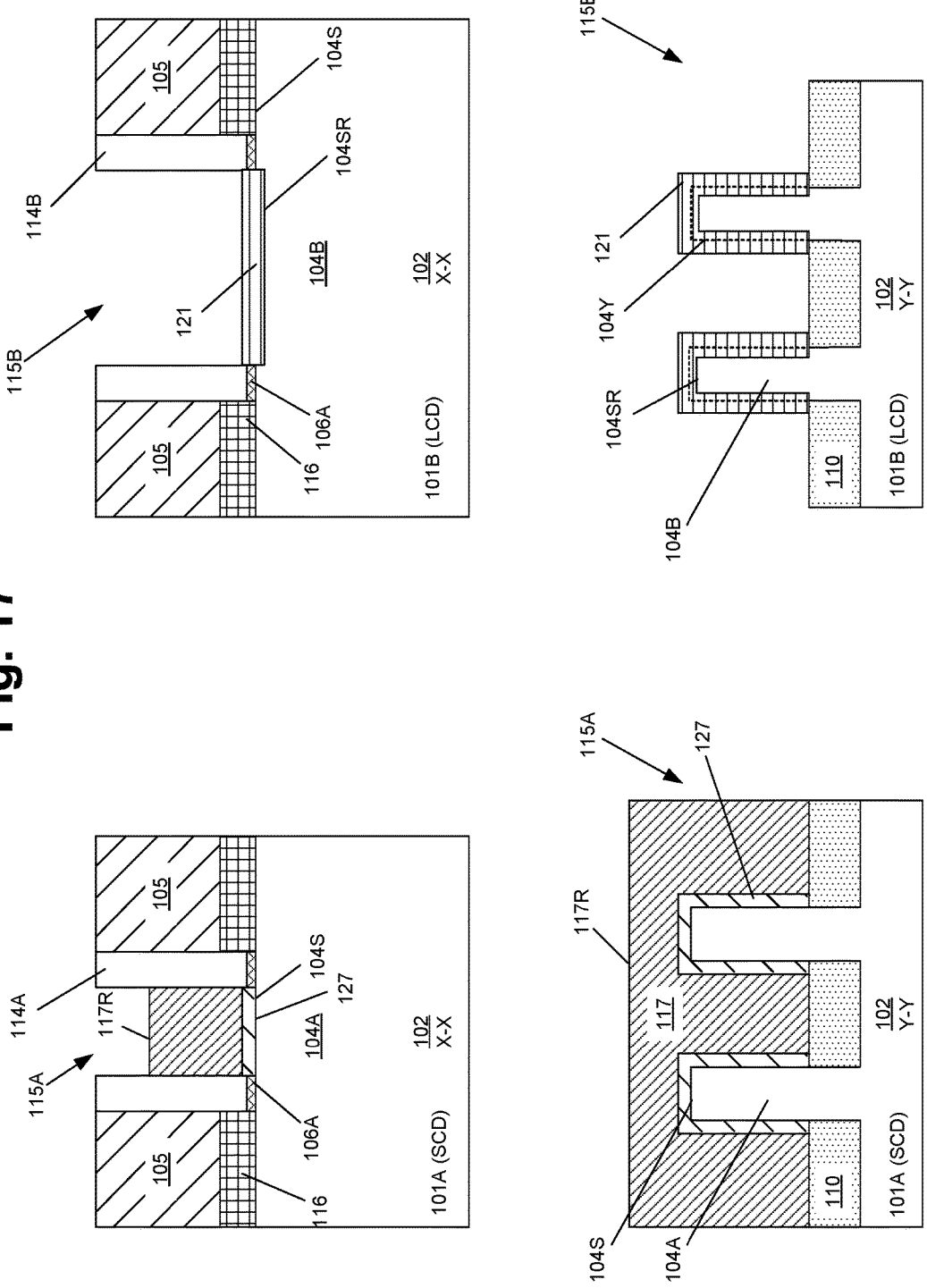

FIG. 17 depicts the devices 101 after the above-described oxidation process was performed to form the above-described sacrificial layer of silicon dioxide 121 on the channel portions of the fins 104B exposed within the replacement gate cavity 115B on the LCD device 101B. Note that the remaining portion of the sacrificial protection layer 117 does not substantially oxidize during this oxidation process and it protects the sacrificial gate insulation layer 127 on the SCD device 101A during the oxidation process. As was the case above, during the formation of the oxidation layer 121, portions of the fins 104B will be consumed, i.e., the oxidized portion of the fins 104B exposed within the replacement gate cavity 115B will be reduced in size. As shown in view Y-Y for the LCD device 101B, a dashed line 104Y simplistically depicts the original or initial size of the fins 104B prior to performing the oxidation process. The amount of the size-reduction of the fins 104B may vary depending upon the application and it may be controlled by controlling the oxidation process and the thickness of the oxidation layer 121. Thus, device designers can control the final size (e.g., height and width) of the portions of the fins 104B in the channel regions of the LCD device 101B relative to the final size (e.g., height and width) of the fins 104A in the channel region of the SCD device 101A. The amount of the size-reduction of the fins 104A on the SCD device 101A may be different from the amount of the size reduction of the fins 104B on the LCD devices 101B.

FIG. 18 depicts the devices 101 after an etching process was performed to remove the sacrificial oxidation layer 121 within the replacement gate cavity 115B on the LCD device 101B so as to expose reduced-size fins 104BR in the channel region of the LCD device 101B having a recessed upper surface 104SR. The remaining portion of the sacrificial protection layer 117 within the replacement gate cavity 115A on the SCD device 101A protects the sacrificial gate insulation layer 127 within the replacement gate cavity 115A on the SCD device 101A during this etching process. As depicted, the reduced-size fins 104BR have a reduced lateral width 104W (measured at a mid-point of the fins 104BR above the insulating material 110) and a reduced vertical height 104H as compared to the corresponding dimension of the fins 104A in the channel region of the SCD device 101A. As before, the ability to selectively decrease the size of the fins 104BR on the LCD device 101B permits device designers to "tune" the threshold voltage of the LCD device 101B relative to the threshold voltage of the SCD device 101A. Accordingly, depending upon the difference between the actual $V_t$ mis-match and the anticipated $V_t$ mis-match, the fins 104B on the LCD device 101B may be reduced in size or "trimmed" so as to achieve the desired anticipated $V_t$ mis-match between the SCD devices and the LCD devices. For example, in the case where the threshold voltage of the LCD device 101B is less than anticipated by the design process, the critical dimension of the fins 104B may be "trimmed" to increase the threshold voltage of the LCD device such that the $V_t$ mis-match between the devices 101A, 101B is at least approximately equal to the anticipated $V_t$ mis-match or the magnitude of the $V_t$ mis-match is reduced to an acceptable level.

Figure 19:
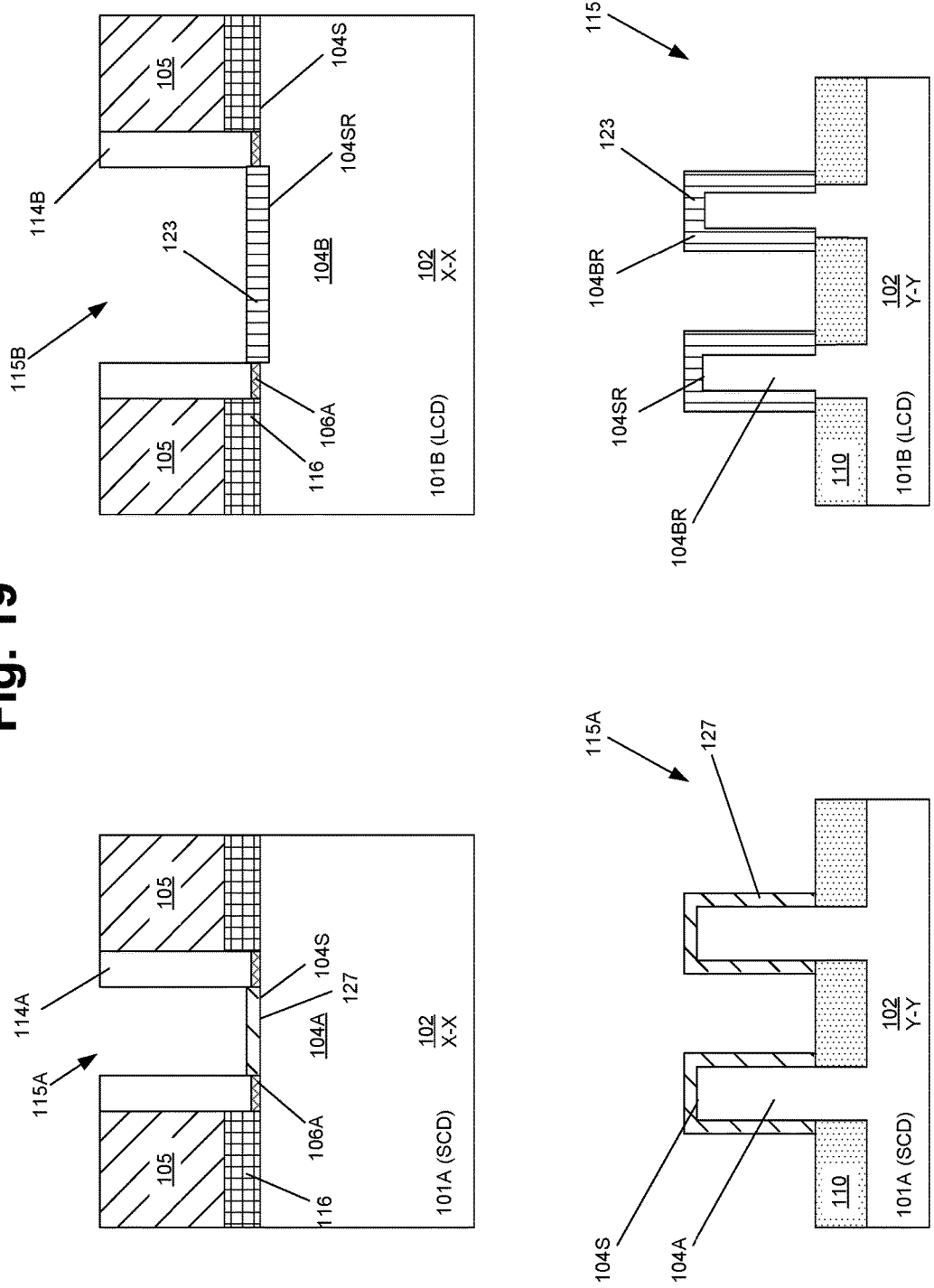

FIG. 19 depicts the devices 101 after several process operations were performed. First, an etching process was performed to remove all of the remaining portions of the recessed sacrificial protection layer 117 from the SCD device 101A. This process operation exposes the sacrificial gate insulation layer 127 within the replacement gate cavity 115A on the SCD device 101A. Thereafter, with the sacrificial gate insulation layer 127 exposed, another oxidation process was performed to form a final LCD gate insulation layer 123 on the fins 104B exposed within the replacement gate cavity 115B on the LCD devices 101B. Note that the final LCD gate insulation layer 123 does not form to any appreciable extent on the SCD device 101A due to the presence of the sacrificial gate insulation layer 127 on the SCD device 101A. The final LCD gate insulation layer 123 may be comprised of a variety of materials, e.g., silicon dioxide, hafnium oxide, a material having a dielectric constant (k) of 10 or greater, etc., and it may be formed to any desired thickness, e.g., 2-3 nm. At this point in the process flow, the sacrificial gate insulation layer 127 may be removed from all of the SCD devices 101A and the final LCD gate insulation layer 123 may be selectively removed from various of the LCD devices 101B so as to comply with circuit-imposed requirements for the formation of the various LCD devices 101B formed for the IC product. The selective removal of the sacrificial gate insulation layer 127 and the final LCD gate insulation layer 123 may be accomplished by performing masking and etching processes.

Figure 20:
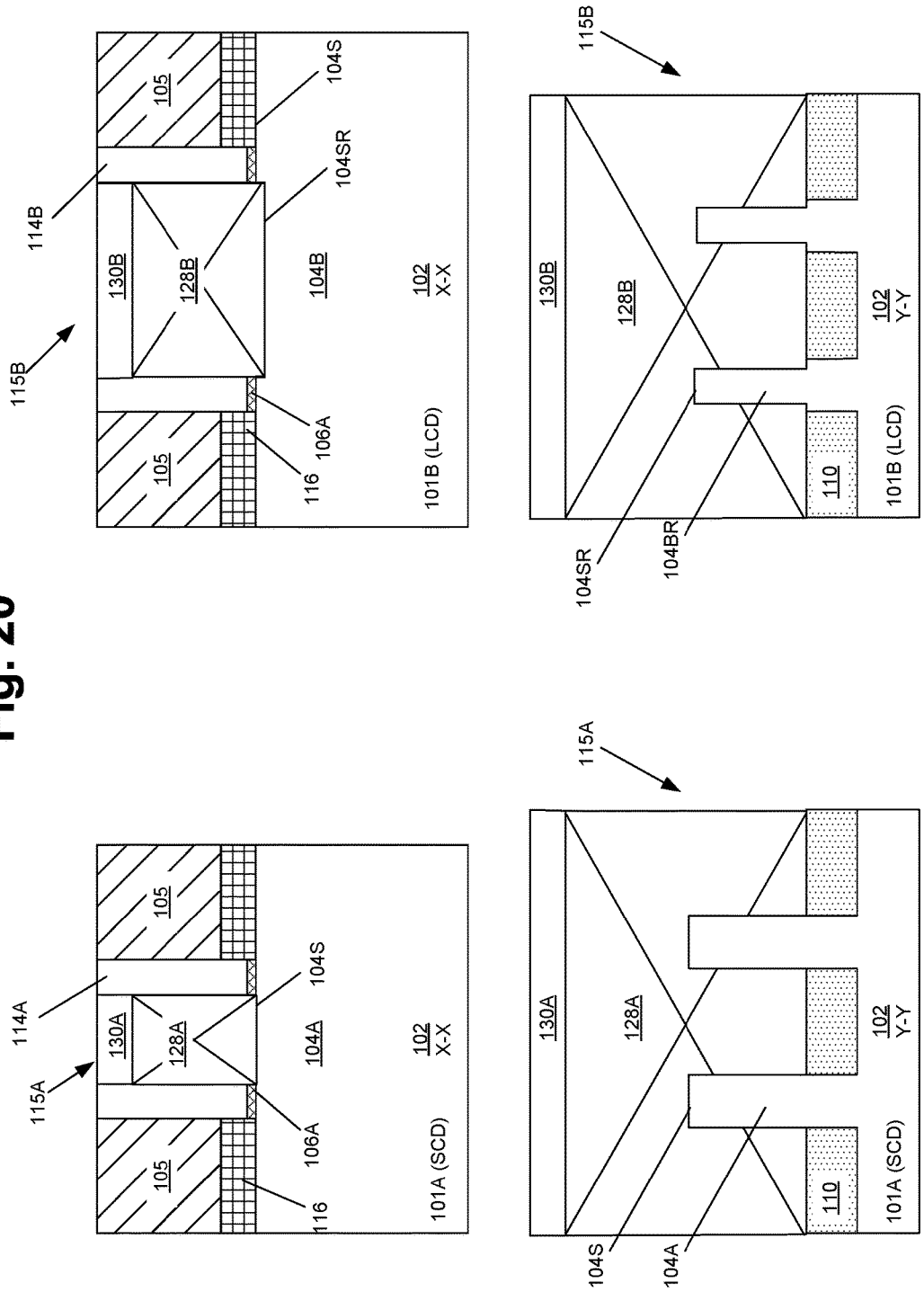

FIG. 20 depicts the devices 101 after several process operations were performed. First, a patterned masking layer (not shown) was formed above the substrate 102 so as to expose all of the SCD devices 101A and a portion of the LCD devices 101B where it is desired to remove the final LCD gate insulation layer 123. Thereafter, an etching process was performed to remove the sacrificial gate insulation layer 127 from all of the SCD devices 101A and the final LCD gate insulation layer 123 from the LCD devices 101B that were exposed by the formation of the patterned masking layer. In the example depicted in FIG. 20, the LCD device 101B is depicted not including the final LCD gate insulation layer 123. Thereafter, the above-described replacement (final) gate structures 128A, 128B (collectively referred to by use of the reference numeral 128) and final gate caps 130A, 130B (collectively referred to by use of the reference numeral 130) were formed in the replacement gate cavities 115A, 115B for the devices 101A, 101B, respectively, using well-known manufacturing techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming first and second fins for a short channel FinFET device and a long channel FinFET device, respectively, wherein a channel portion of each of said first and second fins have substantially a same initial size in terms of a vertical height and lateral width;

forming first and second replacement gate cavities on said short channel FinFET device and said long channel FinFET device, respectively, wherein said channel portion of each of said first and second fins is exposed within said first and second replacement gate cavities, respectively;

forming a gate insulation layer for said long channel FinFET device on said exposed channel portions of both said first and second fins;

performing a conformal deposition process to form a sacrificial protection layer comprised of a substantially non-oxidizable material, wherein said sacrificial protection layer substantially fills said first replacement gate cavity and forms conformally within said second replacement gate cavity;

removing all of said sacrificial protection layer from within said first replacement gate cavity so as to thereby expose said gate insulation layer for said long channel FinFET device within said first replacement gate cavity while leaving a portion of said sacrificial protection layer positioned within said second replacement gate cavity above said gate insulation layer for said long channel FinFET device within said second replacement gate cavity;

removing said exposed gate insulation layer for said long channel FinFET device within said first replacement gate cavity so as to thereby expose said initial sized channel portion of said first fin;

performing an oxidation process to form a sacrificial oxide material selectively on said channel portion of said first fin while not forming said sacrificial oxide material on said channel portion of said second fin;

removing said sacrificial oxide material from said first fin so as to produce a reduced-size channel portion on said first fin that is less than said initial size of said channel portion of said second fin;

forming a first gate structure around said reduced size channel portion of said first fin; and forming a second gate structure around said initial sized channel portion of said second fin.

2. A method, comprising:

forming first and second fins for a short channel FinFET device and a long channel FinFET device, respectively, wherein a channel portion of each of said first and second fins have substantially a same initial size in terms of a vertical height and lateral width;

forming first and second replacement gate cavities on said short channel FinFET device and said long channel FinFET device, respectively, wherein said channel portion of each of said first and second fins is exposed within said first and second replacement gate cavities, respectively;

forming a gate insulation layer for said long channel FinFET device on said exposed channel portions of both said first and second fins;

performing a conformal deposition process to form a sacrificial protection layer comprised of a substantially non-oxidizable material, wherein said sacrificial protection layer substantially fills said first replacement gate cavity and forms conformally within said second replacement gate cavity;

removing all of said sacrificial protection layer from within said first replacement gate cavity so as to thereby expose said gate insulation layer for said long channel FinFET device within said first replacement gate cavity while leaving a portion of said sacrificial protection layer positioned within said second replacement gate cavity above said gate insulation layer for said long channel FinFET device within said second replacement gate cavity;

removing said exposed gate insulation layer for said long channel FinFET device within said first replacement gate cavity so as to thereby expose said initial sized channel portion of said first fin;

after exposing said initial sized channel portion of said first fin and with said portion of said sacrificial protection layer in position within said second replacement gate cavity above said gate insulation layer for said long channel FinFET device, performing an oxidation process to form a sacrificial oxide material selectively on said exposed initial sized channel portion of said first fin while not forming said sacrificial oxide material on said channel portion of said second fin;

removing said sacrificial oxide material from said first fin so as to produce a reduced-size channel portion on said first fin that is less than said initial size of said channel portion of said second fin;

forming a first gate structure around said reduced size channel portion of said first fin; and forming a second gate structure around said initial sized channel portion of said second fin.

3. The method of claim 2, wherein forming said first gate structure comprises forming said first gate structure in said first replacement gate cavity, and wherein forming said second gate structure comprises forming said second gate structure in said second replacement gate cavity.

4. The method of claim 2, wherein said sacrificial protection layer comprises one of a metal, a metal compound, TiN or TaN.

5. The method of claim 2, wherein, after removing said sacrificial oxide material from said first fin, the method further comprises removing said portion of said sacrificial protection layer positioned within said second replacement gate cavity above said gate insulation layer for said long channel FinFET device so as to thereby expose said gate insulation layer for said long channel FinFET device within said second replacement gate cavity.

6. The method of claim 5, wherein, prior to forming said second gate structure, the method further comprises removing said exposed gate insulation layer for said long channel FinFET device from within said second replacement gate cavity so as to thereby expose said initial sized channel portion of said second fin.

7. The method of claim 5, wherein forming said second gate structure comprises forming said second gate structure on said gate insulation layer for said long channel FinFET device positioned within said second replacement gate cavity.

8. A method, comprising:

forming first and second fins for a short channel FinFET device and a long channel FinFET device, respectively, wherein a channel portion of each of said first and second fins have substantially a same initial size in terms of a vertical height and lateral width;

forming first and second replacement gate cavities on said short channel FinFET device and said long channel FinFET device, respectively, wherein said channel portion of each of said first and second fins is exposed within said first and second replacement gate cavities, respectively;

forming a sacrificial gate insulation layer on said exposed channel portions of both said first and second fins;

performing a conformal deposition process to form a sacrificial protection layer comprised of a substantially non-oxidizable material, wherein said sacrificial protection layer substantially fills said first replacement gate cavity and forms conformally within said second replacement gate cavity;

removing all of said sacrificial protection layer from within said second replacement gate cavity so as to thereby expose said sacrificial gate insulation layer within said second replacement gate cavity while leaving a portion of said sacrificial protection layer positioned within said first replacement gate cavity above said sacrificial gate insulation layer within said first replacement gate cavity;

removing said exposed sacrificial gate insulation layer within said second replacement gate cavity so as to thereby expose said initial sized channel portion of said second fin;

after exposing said initial sized channel portion of said second fin and with said portion of said sacrificial protection layer in position within said first replacement gate cavity above said sacrificial gate insulation layer, performing an oxidation process to form a sacrificial oxide material selectively on said exposed initial sized channel portion of said second fin while not forming said sacrificial oxide material on said channel portion of said first fin;

removing said sacrificial oxide material from said second fin so as to produce a reduced-size channel portion of said second fin that is less than said initial size of said channel portion of said first fin;

forming a first gate structure around said reduced size channel portion of said second fin; and forming a second gate structure around said initial sized channel portion of said first fin.

9. The method of claim 8, wherein, after removing said sacrificial oxide material from said second fin, the method further comprises removing said portion of said sacrificial protection layer positioned within said first replacement gate cavity above said sacrificial gate insulation layer so as to thereby expose said sacrificial gate insulation layer within said first replacement gate cavity.

10. The method of claim 8, further comprising removing said portion of said sacrificial protection layer from within said first replacement gate cavity so as to expose said sacrificial gate insulation layer.

11. The method of claim 10, wherein, after exposing said sacrificial gate insulation layer within said first replacement gate cavity, the method further comprises forming a final gate insulation layer for said long channel FinFET device on said reduced size channel portion of said second fin.

12. The method of claim 11, further comprising removing said exposed sacrificial gate insulation layer from within said first replacement gate cavity.

13. The method of claim 12, wherein forming said first gate structure comprises forming said first gate structure in said second replacement gate cavity, and wherein forming said second gate structure comprises forming said second gate structure in said first replacement gate cavity.

14. A method, comprising:
forming first and second fins for a short channel FinFET device and a long channel FinFET device, respectively, wherein a channel portion of each of said first and second fins have substantially a same initial size in terms of a vertical height and lateral width;

forming first and second replacement gate cavities on said short channel FinFET device and said long channel FinFET device, respectively, wherein said channel portion of each of said first and second fins is exposed within said first and second replacement gate cavities, respectively;

forming a sacrificial gate insulation layer on said exposed channel portions of both said first and second fins;

performing a conformal deposition process to form a sacrificial protection layer comprised of a substantially non-oxidizable material, wherein said sacrificial protection layer substantially fills said first replacement gate cavity and forms conformally within said second replacement gate cavity;

removing all of said sacrificial protection layer from within said second replacement gate cavity so as to thereby expose said sacrificial gate insulation layer within said second replacement gate cavity while leaving a portion of said sacrificial protection layer positioned within said first replacement gate cavity above said sacrificial gate insulation layer within said first replacement gate cavity;

removing said exposed sacrificial gate insulation layer within said second replacement gate cavity so as to thereby expose said initial sized channel portion of said second fin;

performing an oxidation process to form a sacrificial oxide material selectively on said channel portion of said second fin while not forming said sacrificial oxide material on said channel portion of said first fin;

removing said sacrificial oxide material from said second fin so as to produce a reduced-size channel portion of said second fin that is less than said initial size of said channel portion of said first fin;

forming a first gate structure around said reduced size channel portion of said second fin; and forming a second gate structure around said initial sized channel portion of said first fin.

* * * * *